(12) United States Patent
Arimoto

(10) Patent No.: US 8,098,080 B2
(45) Date of Patent: Jan. 17, 2012

(54) SEMICONDUCTOR PROGRAMMABLE DEVICE

(75) Inventor: Kazutami Arimoto, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/919,356

(22) PCT Filed: Dec. 24, 2008

(86) PCT No.: PCT/JP2008/073451
§ 371 (c)(1),
(2), (4) Date: Aug. 25, 2010

(87) PCT Pub. No.: WO2009/107309
PCT Pub. Date: Sep. 3, 2009

(65) Prior Publication Data
US 2011/0006806 A1 Jan. 13, 2011

(30) Foreign Application Priority Data

Feb. 29, 2008 (JP) .................................. 2008-050369

(51) Int. Cl.
*G06F 7/38* (2006.01)
*H01L 25/00* (2006.01)
(52) U.S. Cl. ................ 326/38; 326/37; 326/41; 326/47; 326/101
(58) Field of Classification Search .............. 326/37–41, 326/47, 101
See application file for complete search history.

(56) References Cited

U.S. PATENT DOCUMENTS

| | | | |
|---|---|---|---|
| 5,457,410 A | 10/1995 | Ting | |
| 6,344,989 B1 * | 2/2002 | Heile | 365/49.15 |
| 7,002,868 B2 * | 2/2006 | Takahashi | 365/222 |
| 7,010,664 B1 * | 3/2006 | Ballagh et al. | 711/218 |
| 7,656,191 B2 * | 2/2010 | Lewis et al. | 326/40 |
| 2004/0081006 A1 * | 4/2004 | Takahashi | 365/200 |

(Continued)

FOREIGN PATENT DOCUMENTS

JP 9-503886 4/1997

(Continued)

OTHER PUBLICATIONS

Y. Kawamura, A Reconfigurable microcomputer system with PA$^3$ (Programmable Autonomous Address-control-memory Architecture), IEEE Asian Solid State Circuits Conference, Nov. 12-14, 2007, pp. 388-391, IEEE.

(Continued)

*Primary Examiner* — Shawki S Ismail
*Assistant Examiner* — Thienvu Tran
(74) *Attorney, Agent, or Firm* — McDermott Will & Emery LLP

(57) ABSTRACT

An ePLX unit includes a logic unit having an SRAM and a MUX, and a switch unit having an SRAM and a TG for establishing wiring connection in the logic unit. When a composite module is set in the first mode, an Add/Flag control unit uses the SRAMs as a data field and a flag field, respectively, to autonomously control the read address of each of the data field and the flag field in accordance with a control flag stored in the flag field. Furthermore, when the composite module is set in the second mode, the Add/Flag control unit writes configuration information into each of the SRAMs to reconfigure a logic circuit. Consequently, the granularity of the circuit configuration can be rendered variable, which allows improvement in flexibility when configuring a function.

6 Claims, 23 Drawing Sheets

U.S. PATENT DOCUMENTS

| | | |
|---|---|---|
| 2006/0066345 A1 | 3/2006 | Leijten-Nowak |
| 2007/0146178 A1* | 6/2007 | Lewis et al. ............... 341/106 |
| 2007/0186203 A1 | 8/2007 | Sueyoshi et al. |
| 2008/0231316 A1* | 9/2008 | Lewis et al. ............... 326/40 |

FOREIGN PATENT DOCUMENTS

| | | |
|---|---|---|
| JP | 10-093422 | 4/1998 |
| JP | 2000-232162 | 8/2000 |
| JP | 2005-158815 | 6/2005 |
| JP | 2006-518144 | 8/2006 |
| JP | 2007-166579 | 6/2007 |

OTHER PUBLICATIONS

Hirofumi Nakano, et al., "An Embedded Programmable Logic Matrix (ePLX) for flexible functions on SoC", IEEE ASSCC2006 Proceeding of Technical Paper, pp. 219-222.

Nakajima et al., "A 40 GOPS 250mW Massively Parallel Processor Based on Matrix Architecture", IEEE ISSCC (International Solid-State Circuits Conference) 2006, Dig. Tech., Papers, Feb. 2006.

* cited by examiner

SEMICONDUCTOR PROGRAMMABLE DEVICE

RELATED APPLICATIONS

This application is the U.S. National Phase under 35 U.S.C. §371 of International Application No. PCT/JP2008/073451, filed on Dec. 24, 2008, which in turn claims the benefit of Japanese Application No. 2008-050369, filed on Feb. 29, 2008, the disclosures of which Applications are incorporated by reference herein.

TECHNICAL FIELD

The present invention relates to a semiconductor device capable of programming a configuration of a logic circuit, and more particularly to a semiconductor device providing a circuit configuration having granularity rendered variable to allow improvement in flexibility in configuring a function.

BACKGROUND ART

In recent years, in the field of digital equipment such as digital household electrical appliances, personal computers, mobile phones, automobile applications, and white goods, there is an increasing need to improve security by remote diagnosis via a network and to improve system security by self-diagnosis. The above-described needs have been taken into consideration because of the necessity of system monitoring, protection of personal information and the like in terms of security. Furthermore, these techniques will be incorporated in devices as an encryption function and an authentication function for personal/system devices in the field of digital contents such as network contents distribution, digital broadcasting, and media contents service.

Implementing the above-described techniques requires a semiconductor chip that can be replaced as an alternative to a security chip, a system controller and the like incorporated into devices such as digital household electrical appliances, white goods, automobile applications, and high-performance mobile phones; and also that allows security enhancement by other existing contents encryption techniques, secure storage techniques and the like.

For example, in order to protect intellectual property rights, personal information, corporate information and the like in devices of information home appliances, white goods, automobile applications and the like, it is necessary to simultaneously and safely perform user information processing, system safety checks, settlement processing, if needed, and the like including data processing via a network. This requires implementation of a secure function that can withstand attacks by current monitoring, data row monitoring and the like.

Furthermore, in order to prevent leakage of encryption keys, code modification allowing a settlement part to be passed, and the like, it is necessary to implement an accounting function used when decrypting the contents by common key encryption with a programmable device having a self-dynamic logic reconfiguration function. As techniques related to the foregoing, Patent Documents 1-3 disclose the inventions as described below.

According to the invention disclosed in Japanese Patent Laying-Open No. 10-093422 (Patent Document 1), in the programmable logic circuit configured by a plurality of programmable logic cells providing a function of a logic function, a flip-flop, a wiring switch and the like, the logic cells are configured to simultaneously provide one function, in which the circuit implementing each function of the logic cells shares circuit resources such as a memory and a multiplexer. Consequently, circuit functions required by the circuit implemented on the programmable logic circuit can be efficiently implemented even though they are unbalanced, which allows effective use of circuit resources of the programmable logic circuit.

According to the invention disclosed in Japanese Patent Laying-Open No. 2000-232162 (Patent Document 2), in the case where a basic cell including a storage circuit, a readout circuit and a wiring connection switch is functioned as programmable logic means, the resource used when it is functioned as programmable connection means is utilized. Furthermore, a part of the connection line between the cells is twisted to ensure input/output connection also when cells having the same configuration are consecutively arranged. In addition, an input/output signal line at the time when the programmable logic means is applied is configured to be connectable within the cell, to thereby allow implementation of a feedback loop within the cell.

According to the invention disclosed in Japanese Patent Laying-Open No. 2005-158815 (Patent Document 3), a plurality of basic cells having logic blocks performing a logical operation are arranged in a matrix form. Each of the basic cells has a switch block for determining the connection relationship with the basic cells other than itself based on the given connection information. Thus, a part of the network made of regularly connected wiring tracks is replaced with a shortcut wiring track directly connecting the basic cells together which are randomly selected with a predetermined probability p, to construct a wiring network in a manner of a small-world network that allows a desired wiring route to be implemented by using only a small number of switch blocks.

Patent Document 1: Japanese Patent Laying-Open No. 10-093422
Patent Document 2: Japanese Patent Laying-Open No. 2000-232162
Patent Document 3: Japanese Patent Laying-Open No. 2005-158815

DISCLOSURE OF THE INVENTION

Problems To Be Solved By The Invention

The conventional programmable device is significantly large in area size as compared to the hardware IP (Intellectual property), which leads to an increase in cost in terms of the chip size while decreasing its operation speed. Accordingly, improvements in the area and speed have been made as in the above-described Patent Documents 1 to 3. However, circuit resources such as a switch element for switching of the wiring between various circuits are incorporated in advance, which causes a problem that the area penalty is significantly increased as compared to the circuit designed in the standard cell such as an ASIC (Application Specific Integrated Circuit).

Furthermore, in terms of contents protection, a portion for decrypting encryption and an accounting portion are configured on the unsecured hardware, which makes it easier to cause leakage of encryption key and code modification allowing the settlement part to be passed. Accordingly, the need arises to provide a system having higher tamper resistance while ensuring the convenience of digital contents viewing. There is also a problem regarding the security of household electrical appliances.

The present invention has been made in order to solve the above-described problems. An object of the present invention is to provide a programmable semiconductor device which is improved in flexibility when configuring a function.

MEANS FOR SOLVING THE PROBLEMS

According to one embodiment of the present invention, a semiconductor device capable of programming a function is provided which has a plurality of composite modules connected thereto. Each of the plurality of composite modules includes an Add/Flag control unit and an ePLX unit. The ePLX unit includes a logic unit having an SRAM and a MUX for selectively outputting contents stored in the SRAM; and a switch unit having an SRAM and a TG for establishing wiring connection in the logic unit in accordance with contents stored in the SRAM. When the composite module is set in a PM mode, the Add/Flag control unit uses the SRAMs as a data field and a flag field, respectively, to autonomously control a read address of each of the data field and the flag field in accordance with a control flag stored in the flag field. Furthermore, when the composite module is set in an ePLX mode, the Add/Flag control unit writes configuration information into each of the SRAMs to reconfigure a logic circuit.

EFFECTS OF THE INVENTION

According to the present embodiment, as the composite module is set in the PM mode or the ePLX mode, the granularity of the circuit configuration is rendered variable, which allows improvement in flexibility when configuring a function.

BRIEF DESCRIPTION OF THE DRAWINGS

FIG. 19 is a diagram showing the case where the programmable device shown in

FIG. 18 is further mounted as virtualized hardware by software.

DESCRIPTION OF THE REFERENCE SIGNS 1 programming device (SMGP), 2 CPU, 3 nonvolatile memory, 4 SRAM, 5 I/O and peripheral function IP, 6 communication Tx/Rx, 7 bus, 8 information network, 9 wide area network, 10 security monitoring center, 11 contents/accounting server, 100 PA3, 110, 410 Add/Flag control unit, 111 incrementer, 112, 411 selector, 113 FF, 114 control type decoder, 120 memory unit, 121 decoder, 122 flag field, 123 data field, 200 ePLX, 220 LUT array, 221 LUT logic unit, 222 to 225 SRAM, 226 MUX, 230 DFF, 240 interconnect unit, 250 switch unit, 251, 252 P-channel MOS transistor, 253 to 256 N-channel MOS transistor, 257 TG, 300 MX, 301-1 to 301-m operation unit, 302 data register, 303 controller, 304 instruction memory, 305 bus interface, 400 composite module, 420 ePLX unit, 421 control circuit, 422 row decoder, 423 column decoder, 500 ICB, 600 ICE.

BEST MODES FOR CARRYING OUT THE INVENTION

First Embodiment

First, for the purpose of describing the programmable device according to the first embodiment of the present invention, the underlying technique will be described.

In the following description, the device capable of programming a circuit of about 1-4 bit units will be hereinafter referred to as a fine grain device, and the device capable of programming a circuit of 4 bit units or more will be hereinafter referred to as a coarse grain device.

Figure 1:
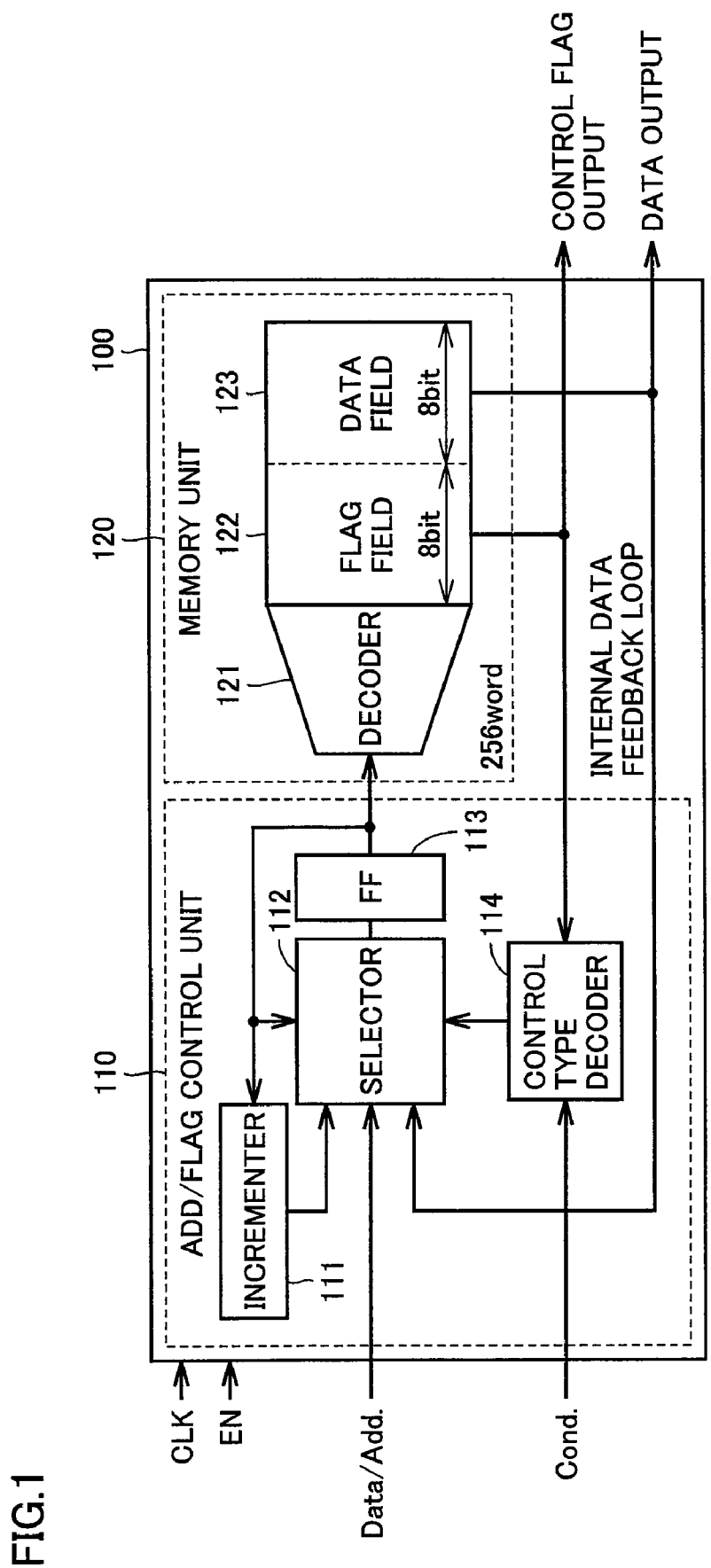
FIG. 1 is a diagram showing the architecture of a coarse grain device.

FIG. 1 is a diagram showing the architecture of a coarse grain device. This coarse grain device 100 can program a state machine, a sequencer, a sequential circuit, and the like, and will be hereinafter referred to as a PA3 (Programmable Autonomous Address-control-memory Architecture). More specifically, see the paper by Yoshifumi Kawamura entitled "A Reconfigurable microcomputer system with PA$^3$" (ASSCC2007 Proceeding of Technical paper, pp. 388-391, November, 2007).

PA3 (100) shown in FIG. 1 includes an Add/Flag control unit 110 and a memory unit 120. Furthermore, Add/Flag control unit 110 includes an incrementer 111, a selector 112, an FF (Flip Flop) 113, and a control type decoder 114.

Memory unit 120 serves as a component into which the configuration information regarding the logic circuit to be implement is written, and includes a decoder 121, a flag field 122 of an 8-bit width and a data field 123 of an 8-bit width.

Decoder 121 decodes the address output from FF 113, and selects the memory cell of an access unit (8 bits) in each of flag field 122 and data field 123. In this case, a read/write signal which is not shown is applied, for performing a read operation or write operation for the selected memory cell.

Selector 112 selects one of the data read from data field 123, the address output from incrementer 111 and the address indicated by a Data/Add. signal supplied from the bus which is not shown, and outputs it to FF 113.

FF 113 outputs the address output from selector 112 to incrementer 111 and decoder 121. Incrementer 111 increments the address output from FF 113 and outputs it to selector 112.

Control type decoder 114 controls selection by selector 112 in accordance with a Cond. signal and a control flag that is output from flag field 122. For example, by causing selector 112 to select the Data/Add. signal, random access of control type decoder 114 to flag field 122 and data field 123 can be allowed.

Furthermore, control type decoder 114 can also repeatedly start a memory read cycle using the address held in FF 113 as a start address and control the selection operation of selector 112 in accordance with the control flag which is read from flag field 122 for each cycle.

According to this configuration, reading of memory unit 120 can be autonomously controlled by PM (100) itself, and memory unit 120 used for implementing a variable logic function can be handled as a circuit equivalent to a logic circuit. This allows a feasible logic configuration and logic size to be flexible. Accordingly, it becomes possible to implement a variable logic function that allows a chip occupying a small area to accommodate a large logic size.

Figure 2:
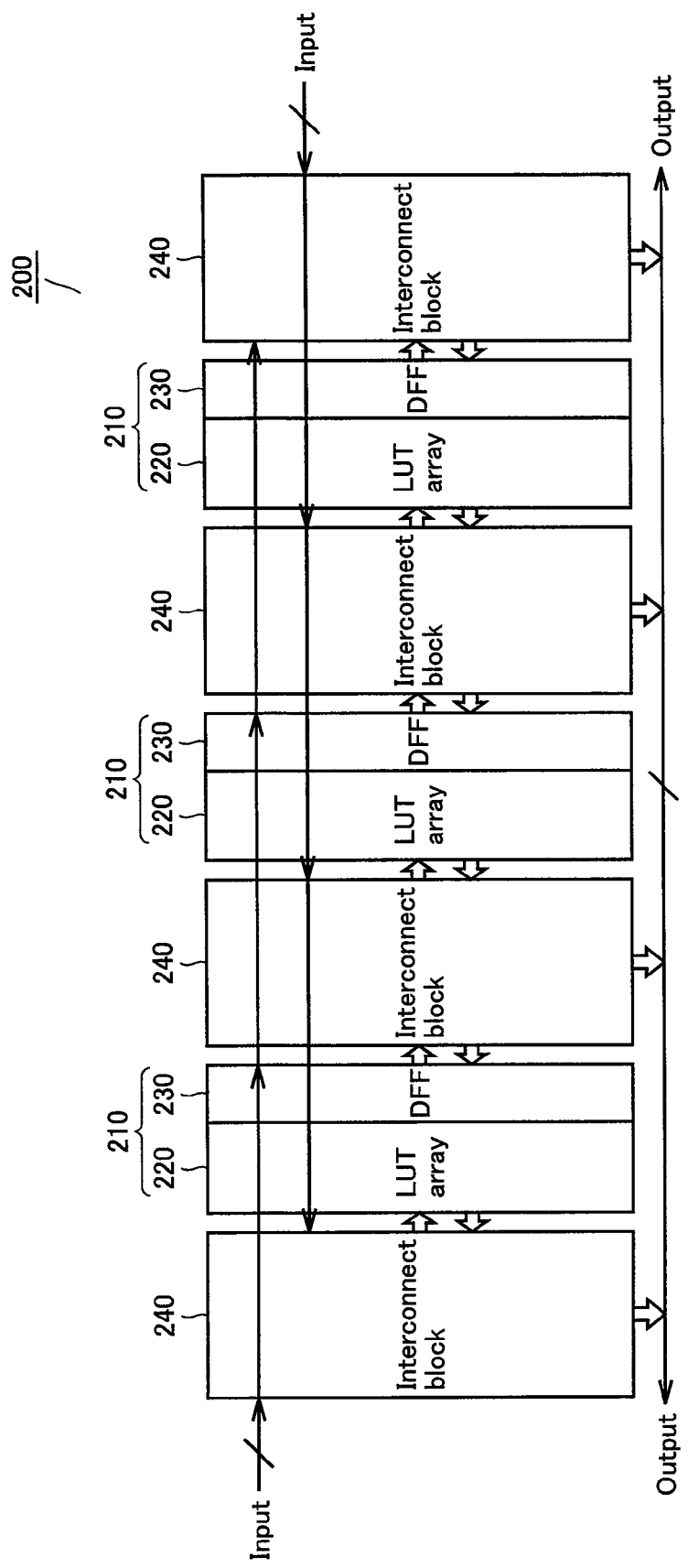
FIG. 2 is a diagram showing the architecture of a fine grain device.

FIG. 2 is a diagram showing the architecture of a fine grain device. This fine grain device 200 can program an I/O (Input/Output) of a combinational circuit, a protocol and the like, and will be hereinafter referred to as an ePLX (embedded Programmable Logic matriX). More specifically, see the paper by Hirofumi Nakano, Takenobu Iwao, Tomoo Hishida, Hiroshi Shimomura, Tomonori Izumi, Takeshi Fujino, Yoshihiro Okuno, and Kazutami Arimoto entitled "An Embedded Programmable Logic Matrix (ePLX) for flexible functions on SoC" (ASSCC2006 Proceeding of Technical paper, pp. 219-222).

Furthermore, ePLX 200 shown in FIG. 2 has a configuration in which blocks 210 each including an LUT (Look Up Table) array 220 and a DFF 230 are connected to each other via an interconnect unit 240.

Figure 3:
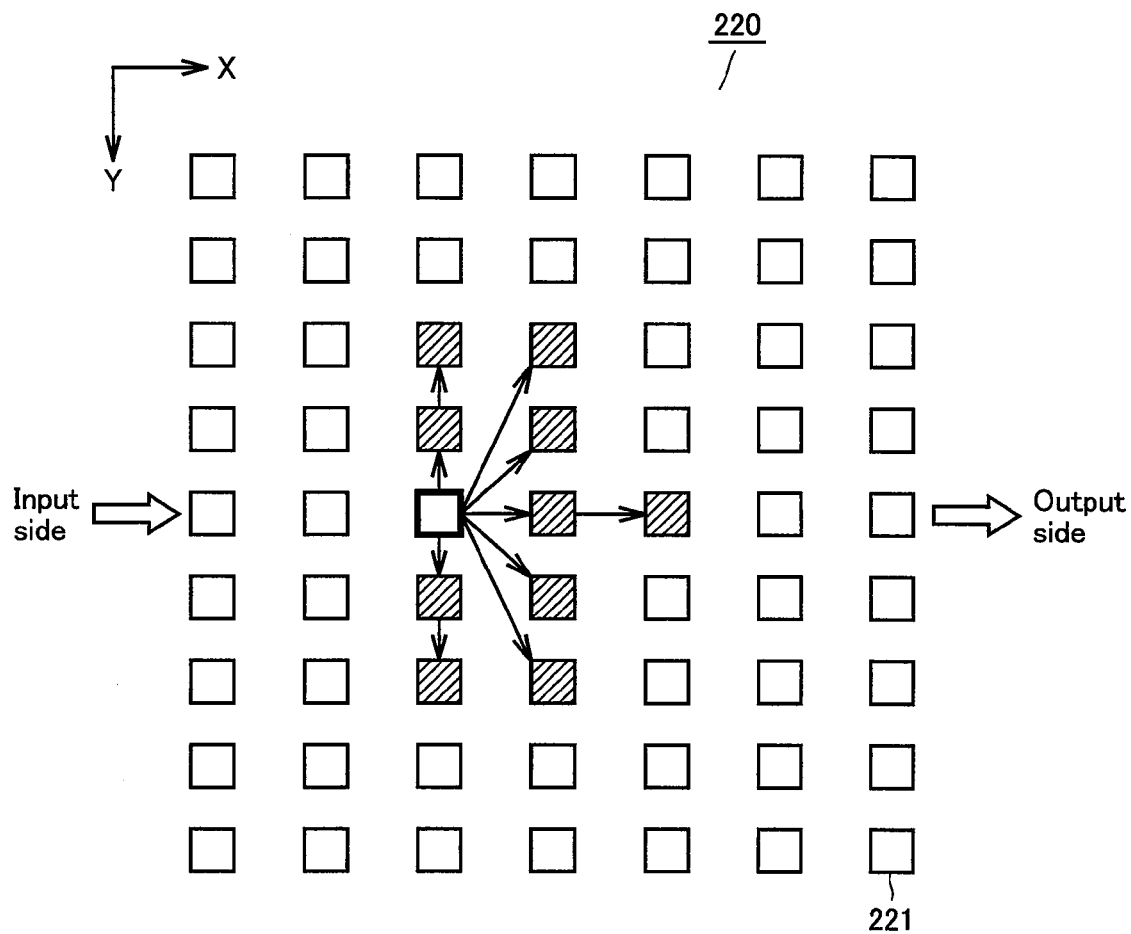
FIG. 3 is a diagram showing a specific example of the architecture of an LUT array 220.

Interconnect unit 240 is interposed between the outside of ePLX (200) and block 210 and also between blocks 210, and communicates a signal therebetween. Furthermore, DFF 230 is configured by a plurality of FF logic units arranged in a row as one-dimensional array. FIG. 3 is a diagram showing a specific example of the architecture of LUT array 220. LUT array 220 is configured by a plurality of LUT logic units 221 densely integrated in a matrix as a two-dimensional array, in which a switch unit described below is disposed between LUT logic units 221 and connects LUT logic units 221 to each other. This switch unit serves to switch the connection between LUT logic units 221.

FIG. 3 shows LUT array 220 including sixty-three LUT logic units 221 (9 rows by 7 columns) by way of example. The signal output from LUT logic unit 221 can be input into four LUT logic units including two units located above LUT logic unit 221 and two units located below LUT logic unit 221 which are arranged in the same column, five LUT logic units arranged in the next column to the right, and one LUT logic unit arranged in the second column to the right of the LUT logic unit 221.

Figure 4:
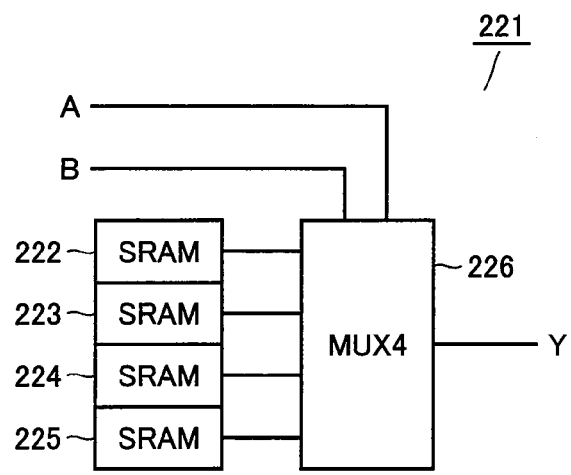
FIG. 4 is a diagram showing a configuration example of an LUT logic unit 221.

FIG. 4 is a diagram showing a configuration example of LUT logic unit 221. LUT logic unit 221 includes 4-bit configuration memories (SRAM) 222-225 and a multiplexer (MUX4) 226 having four inputs and one output. By setting the value corresponding to a logic function for each of 4-bit configuration memories 222-225, a logic circuit corresponding to the logic function can be configured.

Figure 5:
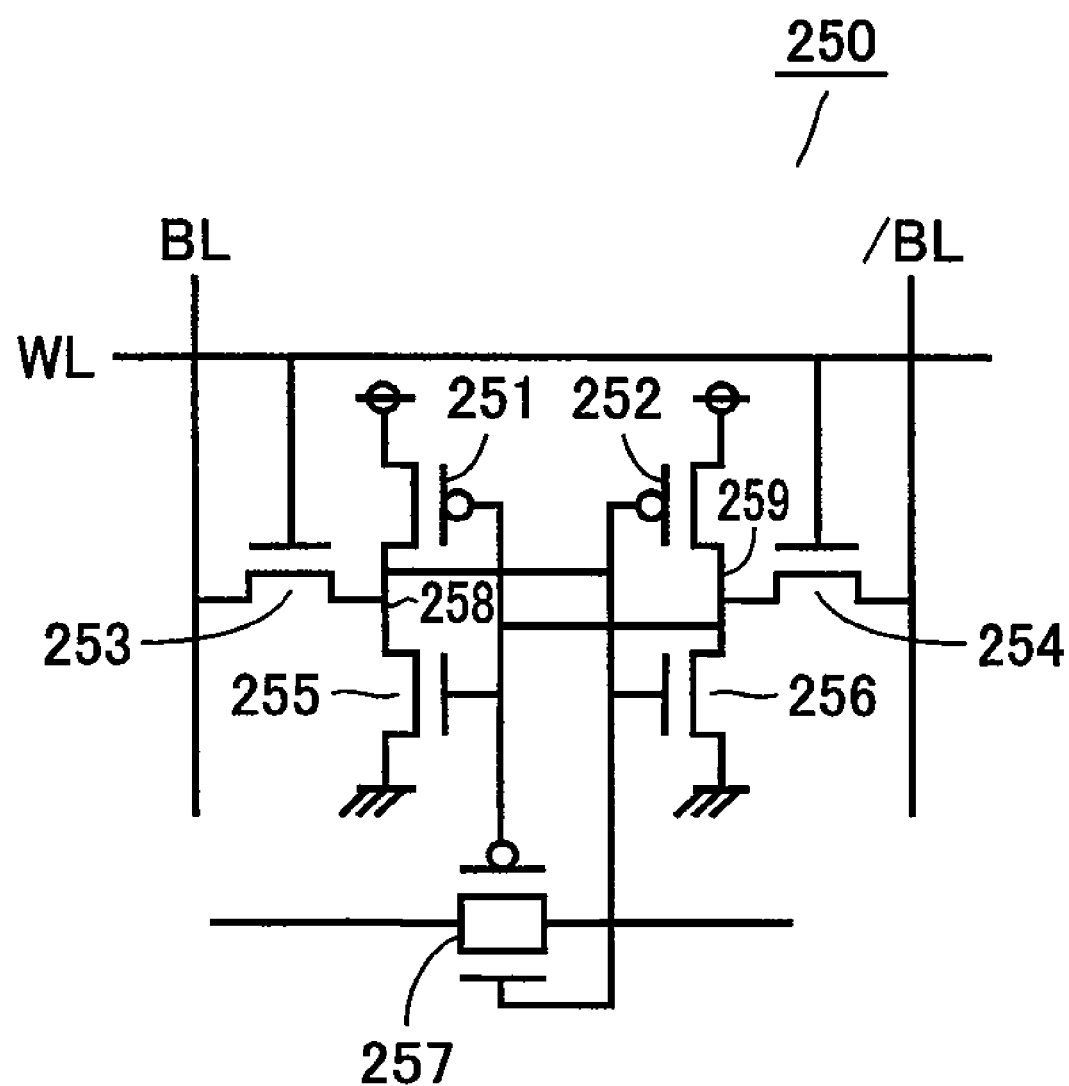
FIG. 5 is a diagram showing a configuration example of a switch unit 250.

FIG. 5 is a diagram showing a configuration example of a switch unit 250. This switch unit 250 consists of an SRAM unit and a transfer gate (TG) 257.

The SRAM unit includes P-channel MOS transistors 251 and 252, and N-channel MOS transistors 253 to 256. P-channel MOS transistor 251 is connected between a power supply node and a storage node 258, and has its gate connected to a storage node 259. P-channel MOS transistor 252 is connected between the power supply node and storage node 259, and has its gate connected to storage node 258.

N-channel MOS transistor 255 is connected between storage node 258 and a ground node, and has its gate connected to storage node 259. N-channel MOS transistor 256 is connected between storage node 259 and a ground node, and has its gate connected to storage node 258. In response to the potential on a word line WL, N-channel MOS transistors 253 and 254 connect storage nodes 258 and 259 to bit lines BL and /BL, respectively.

TG 257 serves to effect connection/disconnection in accordance with the potentials on storage nodes 258 and 259. In other words, when "0" is stored in the SRAM unit, TG 257 is turned off to cause the wiring to be disconnected. When "1" is stored in the SRAM unit, TG 257 is turned on to cause the wiring to be connected.

Figure 6:
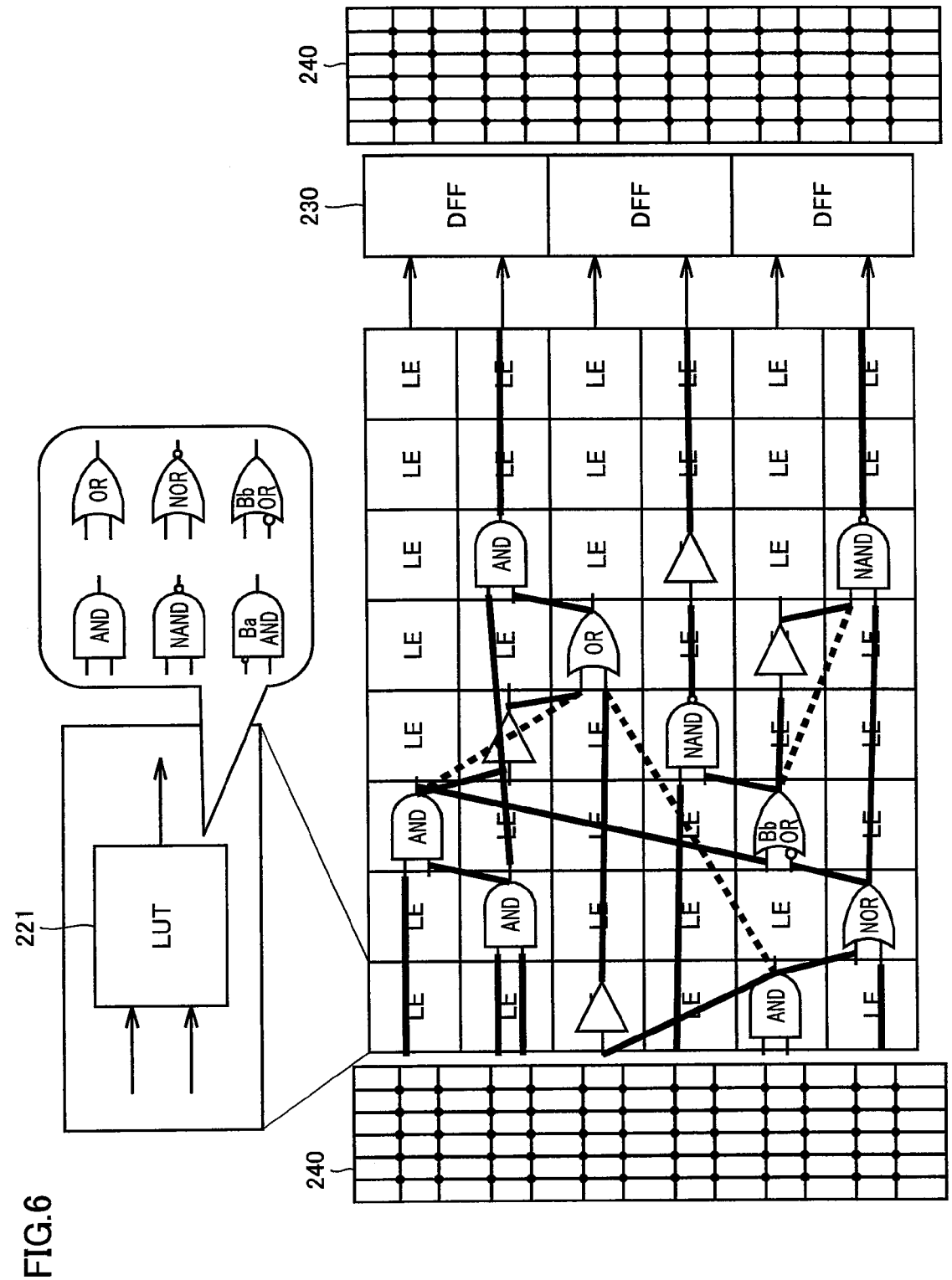
FIG. 6 is a diagram showing an example of a logic circuit implemented by an ePLX 200.

FIG. 6 is a diagram showing an example of a logic circuit implemented by ePLX 200. By setting a value for each of SRAMs 222 to 225 in LUT logic unit 221 shown in FIG. 4, a logic circuit is configured in LUT logic unit 221. By setting a value for the SRAM unit in switch unit 250 shown in FIG. 5, connection between adjoining LUT logic units 221 is established. It is to be noted that LUT logic unit 221 can also be used not as a logic circuit but as wiring.

Interconnect unit 240 which is provided for establishing connection in the vertical wiring region establishes connection between adjoining LUT arrays 220 with DFF 230 interposed therebetween.

Figure 7:
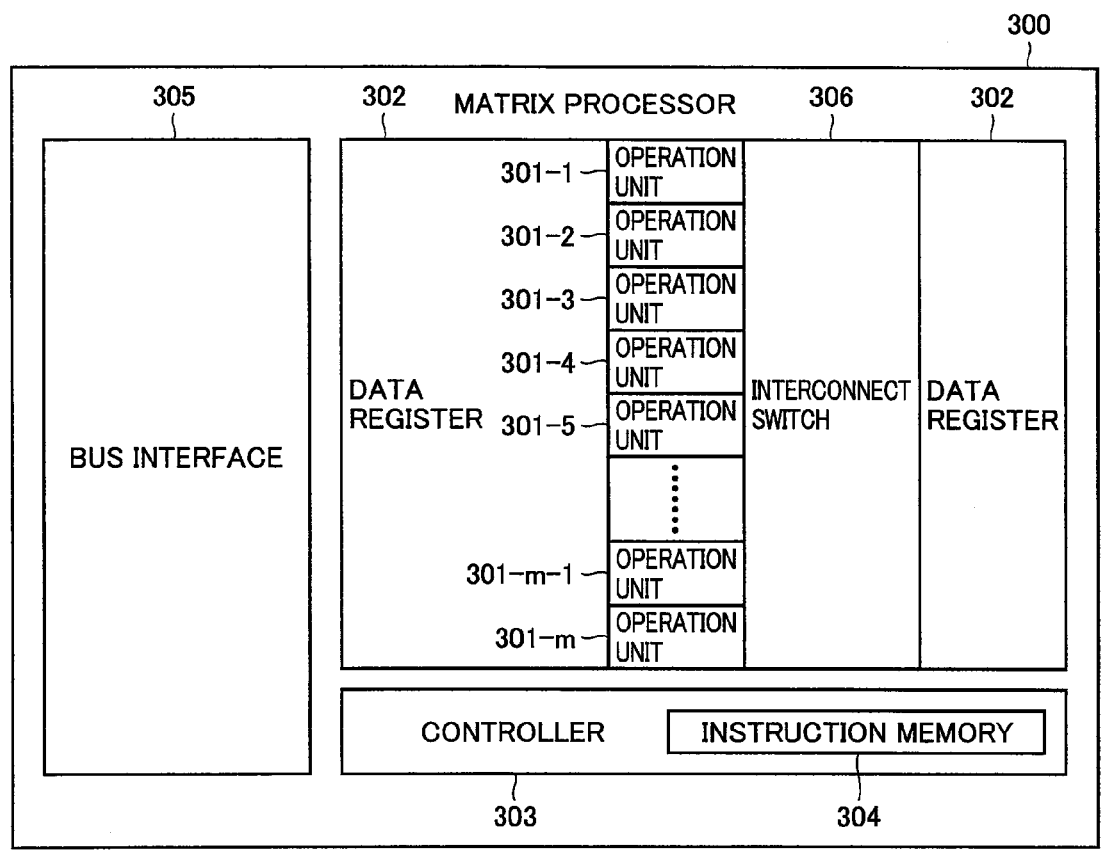
FIG. 7 is a diagram showing another architecture of the fine grain device.

FIG. 7 is a diagram showing another architecture of the fine grain device. This fine grain device 300 is a massively parallel SIMD (Single Instruction Multiple Data) processor and will be hereinafter referred to as an MX (Matrix Processor). More specifically, see the paper by Masami Nakajima, Hideyuki Noda, Katsumi Dosaka, Kiyoshi Nakata, Motoki Higashida, Osamu Yamamoto, Katsuya Mizumoto, Hiroyuki Kondo, Yukihiko Shimazu, Kazutami Arimoto, Kazunori Saitoh, and Tom Shimizu entitled "A 40GOPS 250 mW Massively Parallel Processor Based on Matrix Architecture" (IEEE International Solid Circuits Conference, Dig. Tech., Papers, pp. 410-411, February, 2006).

MX 300 includes m operation units 301-1 to 301-m, a data register 302, a controller 303, a bus interface 305, and an interconnect switch 306. Furthermore, controller 303 includes an instruction memory 304.

For example, data register 302 stores media data as an array of sampled data. Operation units 301-1 to 301-m each perform parallel processing by performing an operation for each element in the array data stored in data register 302.

Bus interface 305 inputs and outputs data via an external bus which is not shown. When receiving a signal processing request via a bus, bus interface 305 outputs the signal processing request to controller 303. Furthermore, when receiving a signal processing result from controller 303, bus interface 305 outputs the signal processing result via the bus.

When receiving the signal processing request from bus interface 305, controller 303 causes operation units 301-1 to 301-m to sequentially perform the operation corresponding to the microcode stored in instruction memory 304 for execution of the signal processing corresponding to the signal processing request. Controller 303 then outputs the signal processing result to bus interface 305.

Interconnect switch 306 can perform switching of connection paths between operation units 301-1 to 301-m, and can also cause operation units 301-1 to 301-m to perform an operation of each data in different entries. Accordingly, data operation can be carried out at high speed by causing operation units 301-1 to 301-m to perform parallel operations for different data stored in the entries.

As described with reference to FIG. 1, PM (100) consists of Add/Flag control unit 110 and memory unit 120, in which most of its area is occupied by memory unit 120 that can be configured by an SRAM. Furthermore, as described with reference to FIGS.

2-6, ePLX 200 consists of LUT logic unit 221 and switch unit 250, in which most of its area is occupied by an SRAM. Described below is a composite module that can be operated with any one of PA3 (100) and ePLX 200 by sharing the SRAM unit.

Figure 8:
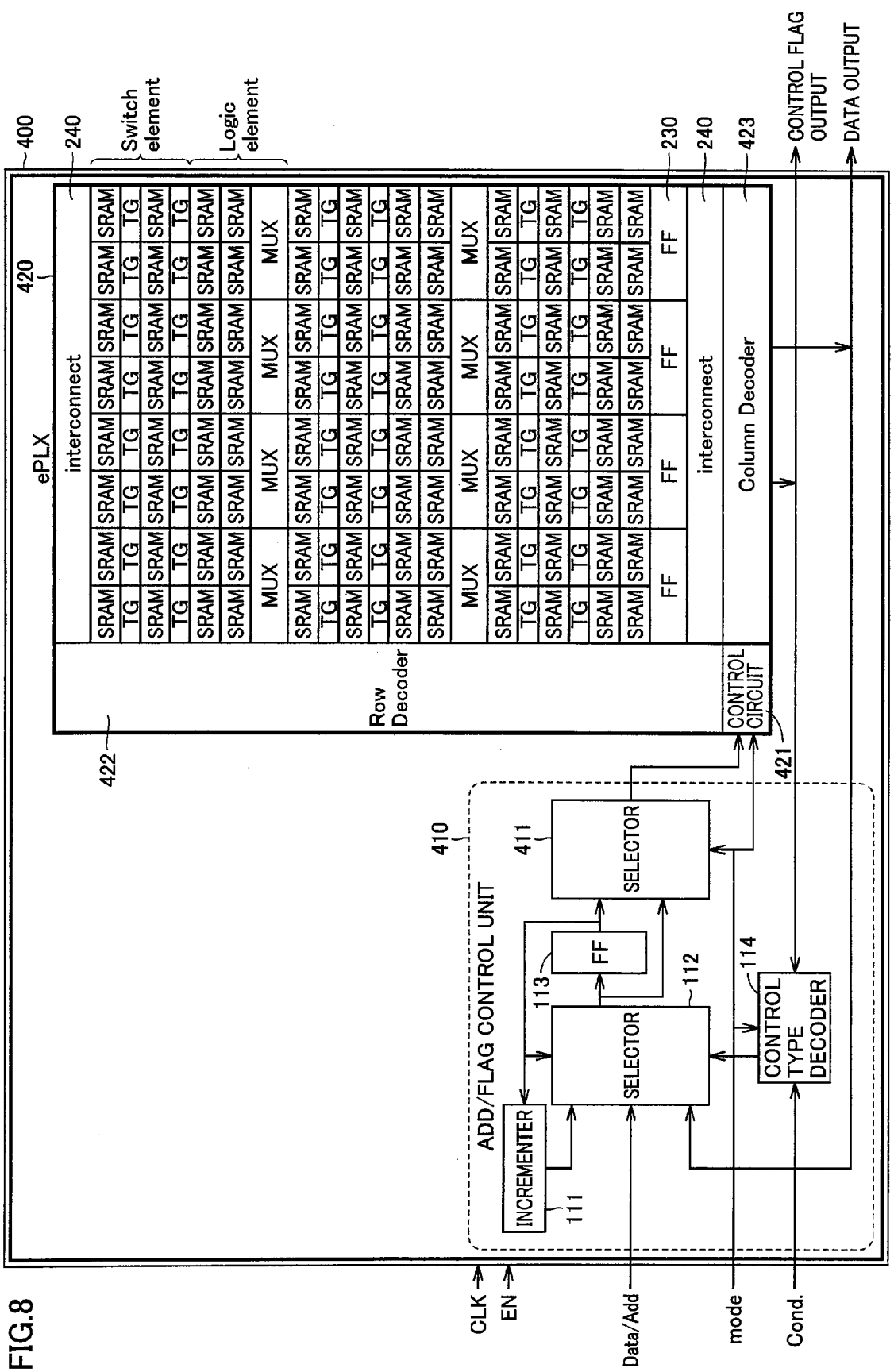
FIG. 8 is a diagram showing a configuration example of a composite module in the first embodiment of the present invention.

FIG. 8 is a diagram showing a configuration example of the composite module in the first embodiment of the present invention. This composite module 400 includes an Add/Flag control unit 410 and an ePLX unit 420.

As compared to Add/Flag control unit 110 shown in FIG. 1, Add/Flag control unit 410 is different in that a selector 411 is added which selectively outputs the address output from selector 112 and the address output from FF 113 to a control circuit 421 and that selection is made based on the mode signal as to whether the composite module operates as PM (100) or as ePLX 200.

When the PM is selected based on the mode signal (hereinafter referred to as a PM mode), selector 411 selects the address output from FF 113 and outputs the address. In the PA3 mode, control type decoder 114 performs the same operation as that of control type decoder 114 shown in FIG. 1. Accordingly, in the PM mode, Add/Flag control unit 410 performs the same operation as that of Add/Flag control unit 110 shown in FIG. 1.

Furthermore, when the ePLX is selected based on the mode signal (hereinafter referred to as an ePLX mode), selector 411 selects the address output from selector 112 and outputs the address, in which case incrementer 111 does not operate. In the ePLX mode, control type decoder 114 does not accept a Cond. signal but only performs switching of selector 112. Thus, in the ePLX mode, Add/Flag control unit 410 performs a read/write operation for the SRAM within ePLX unit 420 in accordance with the address represented by the Data/Add signal.

Furthermore, ePLX unit 420 is identical in configuration to ePLX 200 shown in FIGS. 2 to 6, in which one switch unit (switch element) 250 consists of one SRAM and one transfer gate (TG), and one LUT logic unit (logic element) 221 consists of four SRAMs and one MUX.

Control circuit 421 outputs the address output from selector 411 to a row decoder 422 and a column decoder 423, and controls the read/write operation in accordance with the control signal which is not shown. In this case, the SRAM selected by row decoder 422 and column decoder 423 is subjected to the read/write operation.

Figure 9:
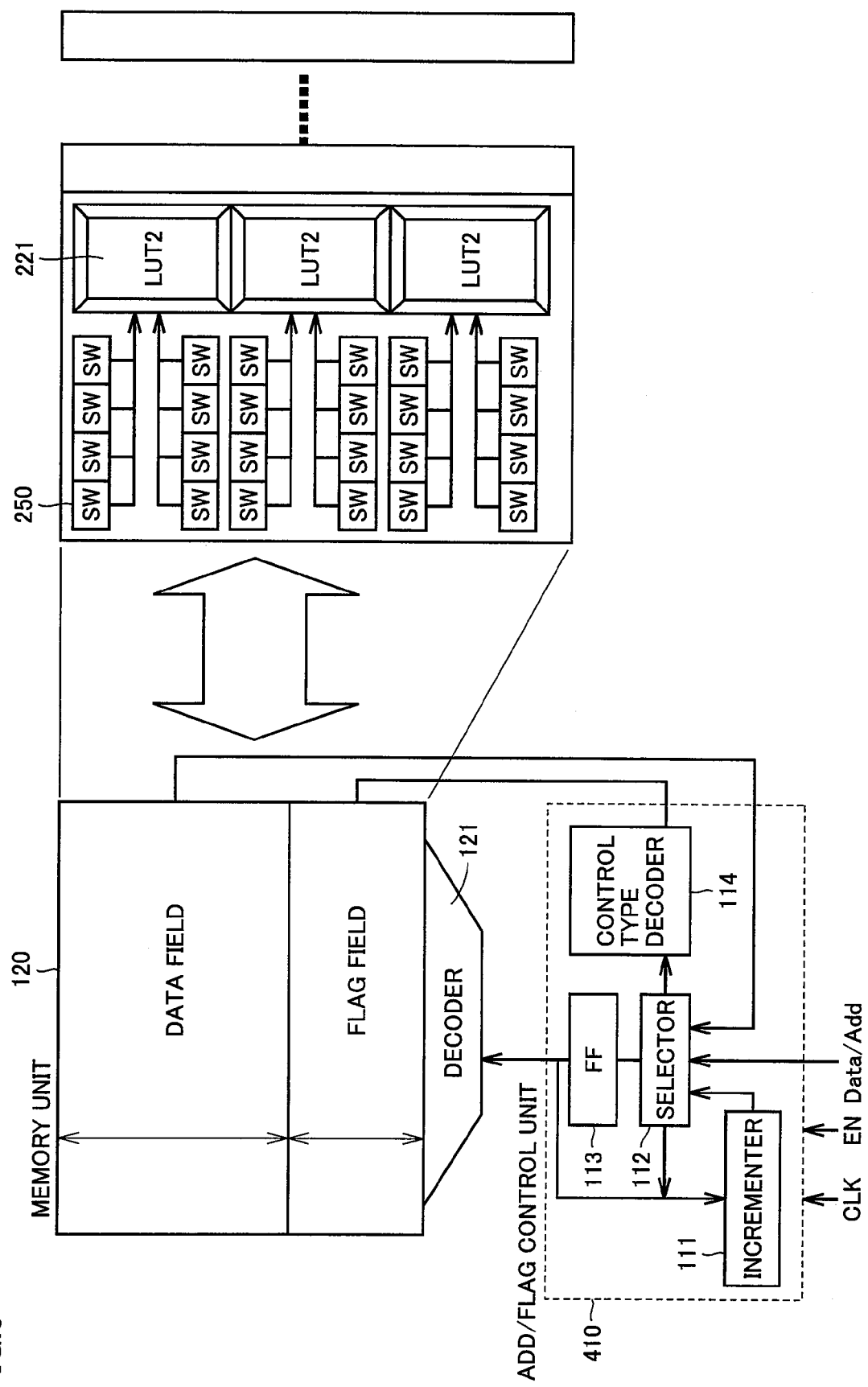
FIG. 9 is a diagram schematically showing sharing between a memory unit 120 in PM (100) and LUT logic unit 221 and switch unit 250 in ePLX 200.

FIG. 9 is a diagram schematically showing sharing between memory unit 120 in PM (100), and LUT logic unit 221 and switch unit 250 in ePLX 200. As described with reference to FIG. 1, memory unit 120 in PM (100) includes a data field and a flag field and can be configured by an SRAM. Furthermore, as described with reference to FIGS. 2-6, each of LUT logic unit 221 and switch unit 250 within ePLX 200 can be configured by an SRAM and a transfer gate (TG) 257. This shows that components other than MUX 226 in LUT logic unit 221 and TG 257 in switch unit 250 are sharable.

Figure 10:
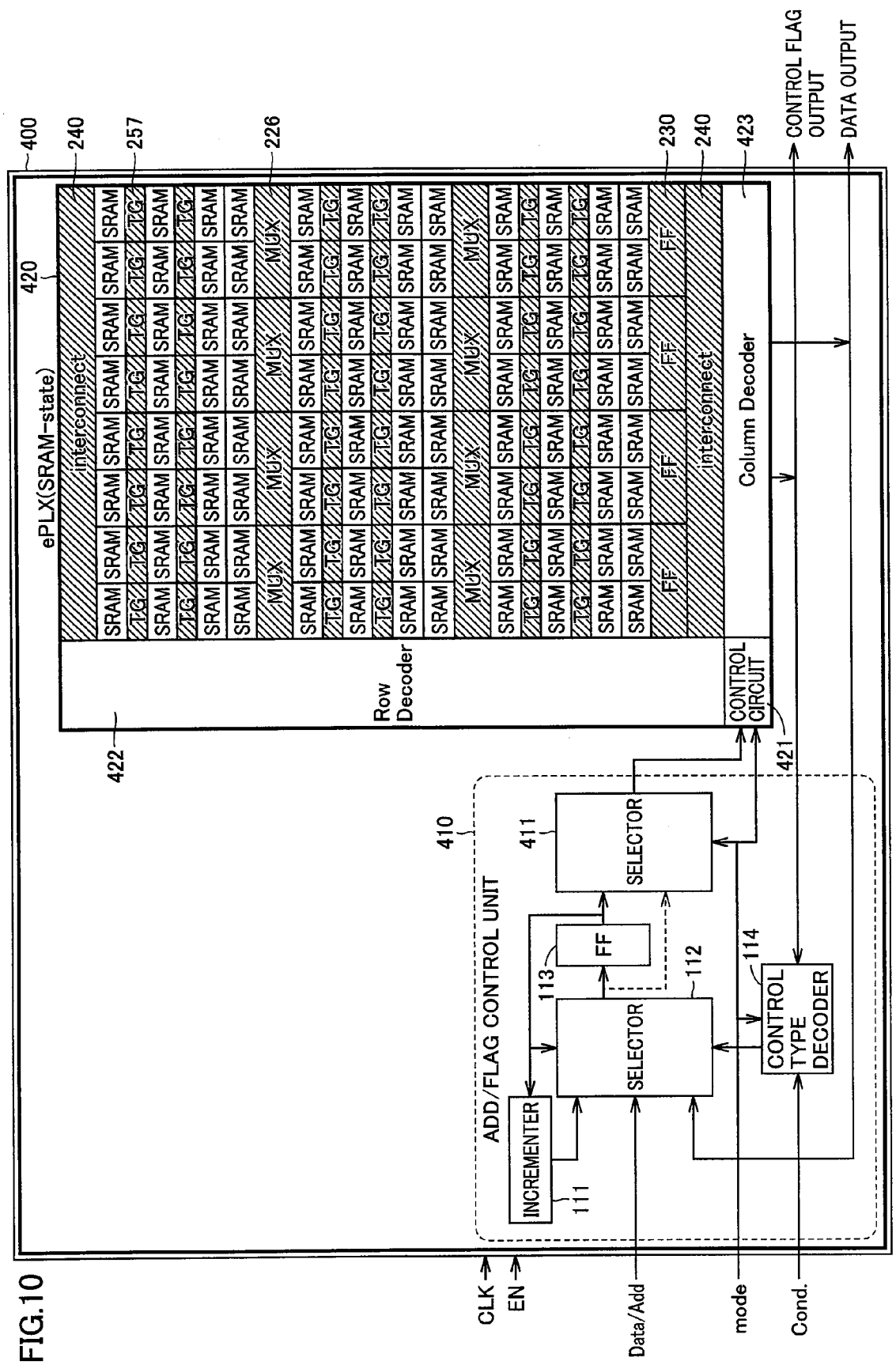
FIG. 10 is a diagram showing the internal configuration at the time when a composite module 400 is used in the PA3 mode.

FIG. 10 is a diagram showing the internal configuration at the time when composite module 400 is used in the PA3 mode. When composite module 400 is used in the PM mode, Add/Flag control unit 410 performs the same operation as that of Add/Flag control unit 110 shown in FIG. 1, as described above. Furthermore, FF 230, interconnect unit 240, TG 257, and MUX 226 within ePLX unit 420 are not used. Therefore, ePLX unit 420 is controlled to operate as an SRAM.

Figure 11:
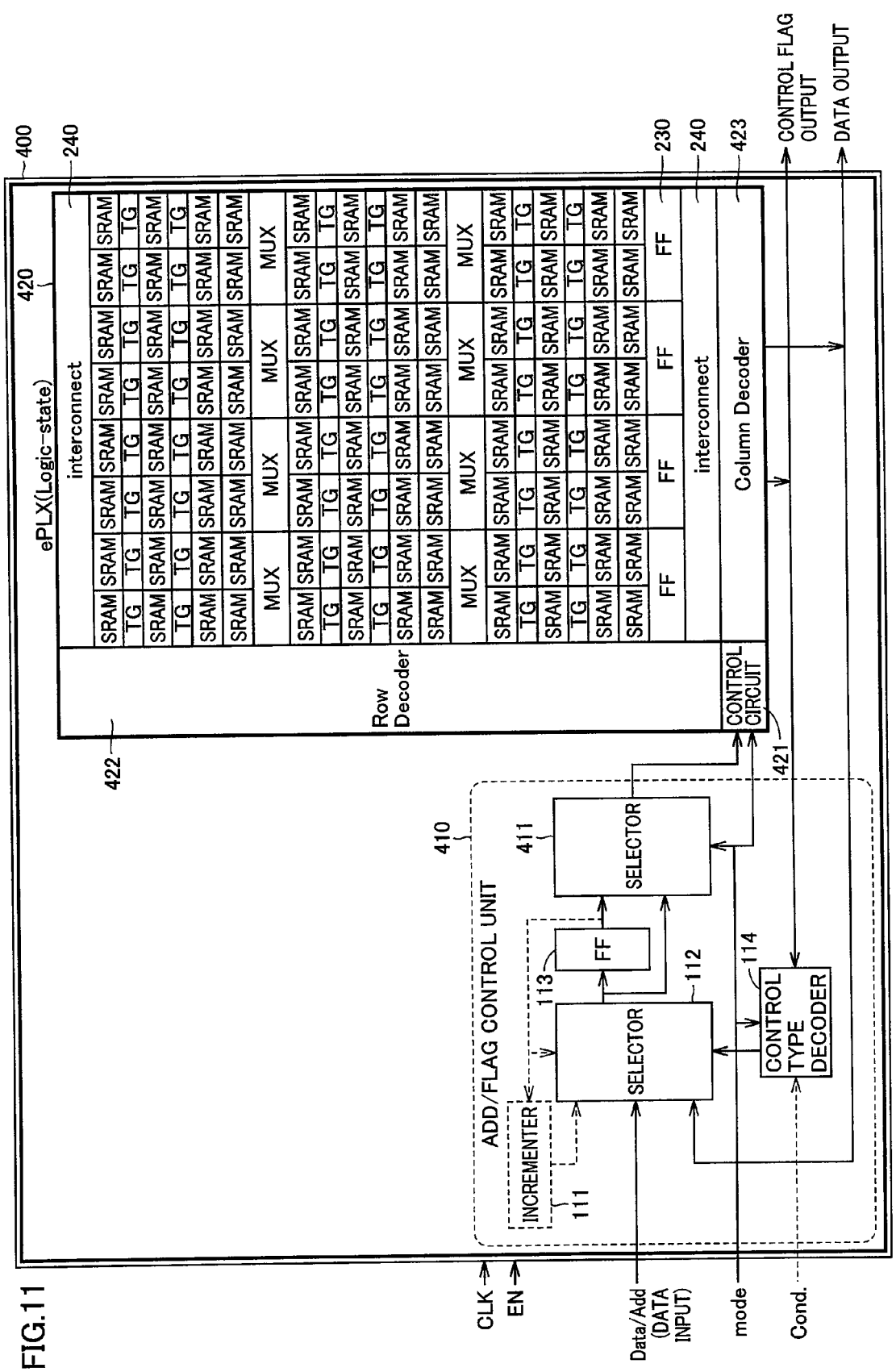
FIG. 11 is a diagram showing the internal configuration at the time when composite module 400 is used in the ePLX mode.

FIG. 11 is a diagram showing the internal configuration at the time when composite module 400 is used in the ePLX mode. When composite module 400 is used in the ePLX mode, Add/Flag control unit 410 controls the read/write operation for the SRAM within ePLX unit 420 in accordance with the address represented by the Data/Add signal, as described above. Furthermore, all components in ePLX unit 420 are used for reconfiguration of a logic circuit.

Figure 12:
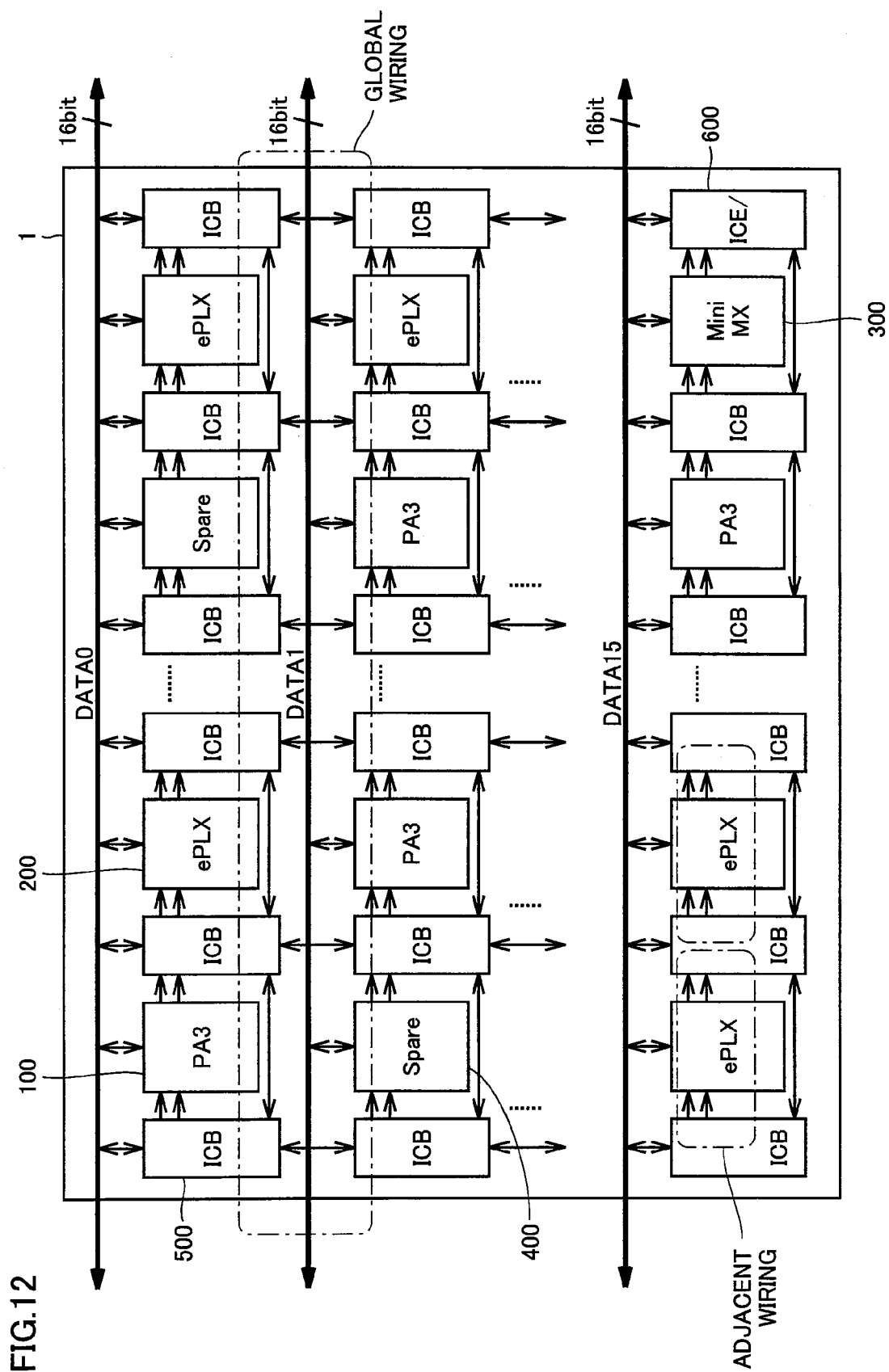
FIG. 12 is a diagram showing a configuration example of a programmable device in the first embodiment of the present invention.

FIG. 12 is a diagram showing a configuration example of a programmable device in the first embodiment of the present invention. This programmable device 1 is basically configured in such a manner that composite modules 400 shown in FIG. 8 are arranged in the matrix form, and selection is made from outside as to whether each composite module is used in the PM mode or in the ePLX mode.

Composite modules 400 are connected via interconnect units (ICB) 500, respectively. Composite module 400 and ICB 500 at the uppermost stage are connected, for example, to a 16-bit data bus (DATAO). Composite module 400 receives the data and address through this data bus.

ICB 500 at the uppermost stage can output the data through the data bus (DATAO) to composite module 400 on the right side. Furthermore, the output signal from composite module 400 on the left side can also be output to composite module 400 on the right side. Furthermore, the data on the data bus or the output signal from composite module 400 on the right side can also be output to ICB 500 located therebelow.

FIG. 12 shows PM (100) corresponding to a portion in which composite module 400 operates in the PA3 mode and ePLX 200 corresponding to a portion in which composite module 400 operates in the ePLX mode. The figure also shows a Spare corresponding to a spare composite module 400.

MX 300 and an ICE 600 are arranged on the right side at the lowermost stage. With regard to MX 300, although the SRAM within composite module 400 can be used as data register 302 within MX 300, operation units 301-1 to 301-m each configured by composite module 400 are rendered redundant. This is the reason why composite module 400 is used as data register 302 within MX 300, and other components such as operation units 301-1 to 301-m and interconnect switch 306 are separately prepared as ICE 600.

Electric power supply to each composite module 400 can be independently controlled. Furthermore, clocks supplied to each composite module 400 can also be independently controlled. Accordingly, this configuration allows power gating requiring reduction in power consumption, DVS (dynamic voltage scheduling) and DVFS (dynamic voltage/frequency scheduling) to be addressed. Furthermore, the above-described voltage control may be performed based on the data stored in the nonvolatile memory, to thereby achieve a dependability function allowing instantaneous power failure to be addressed.

Figure 13:
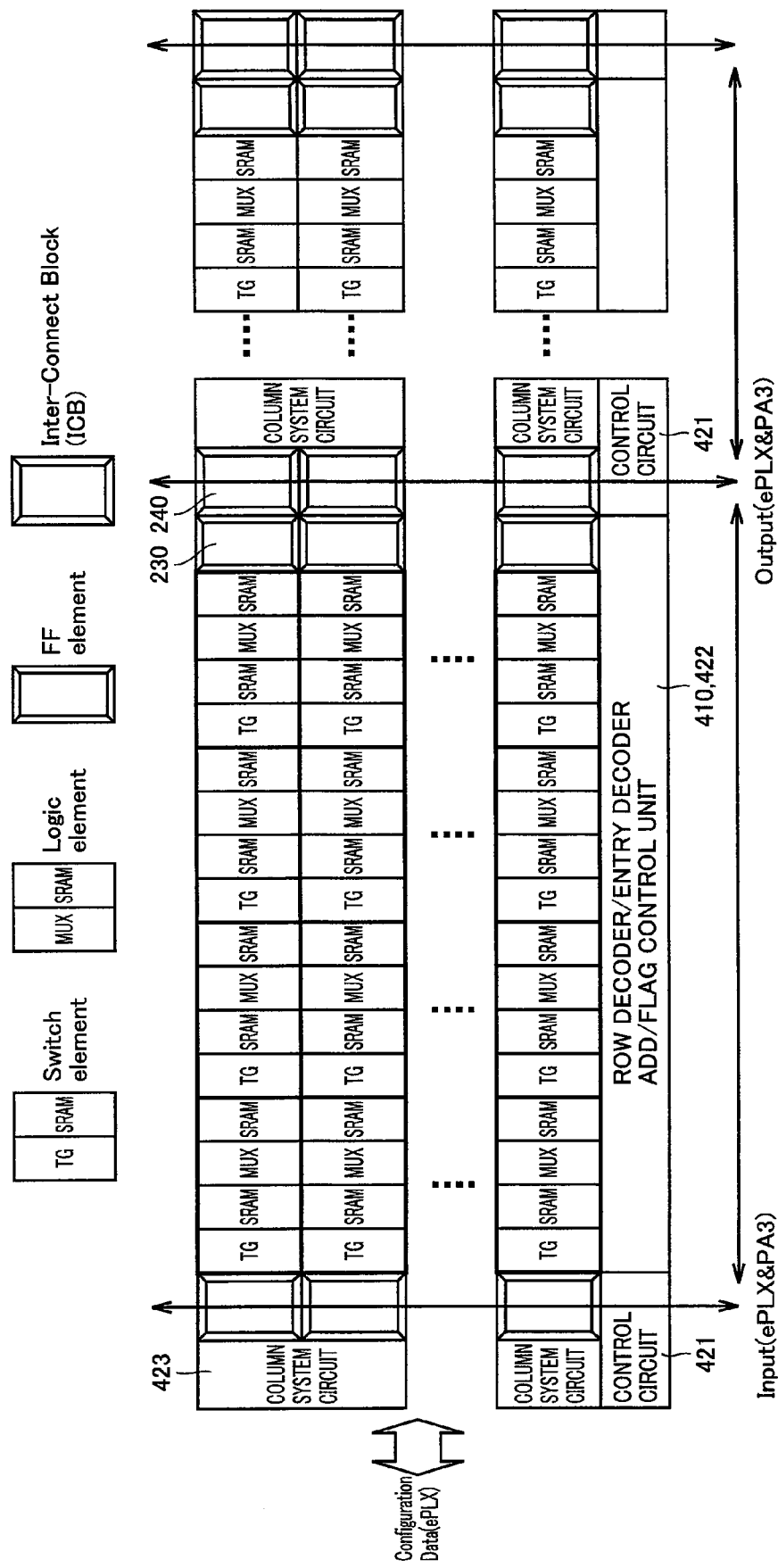
FIG. 13 is a diagram showing arrangement of each component constituting a programmable device 1 in the first embodiment of the present invention.

FIG. 13 is a diagram showing arrangement of each component constituting programmable device 1 in the first embodiment of the present invention. In programmable device 1 shown in FIG. 13, circuits such as Add/Flag control unit 410, control circuit 421, row decoder 422, and column decoder 423 each are configured as a stationary circuit. These circuits can also be configured by a programmable circuit such as ePLX 200, which are however rendered redundant. Accordingly, the circuits each are configured as a stationary circuit.

Figure 14:
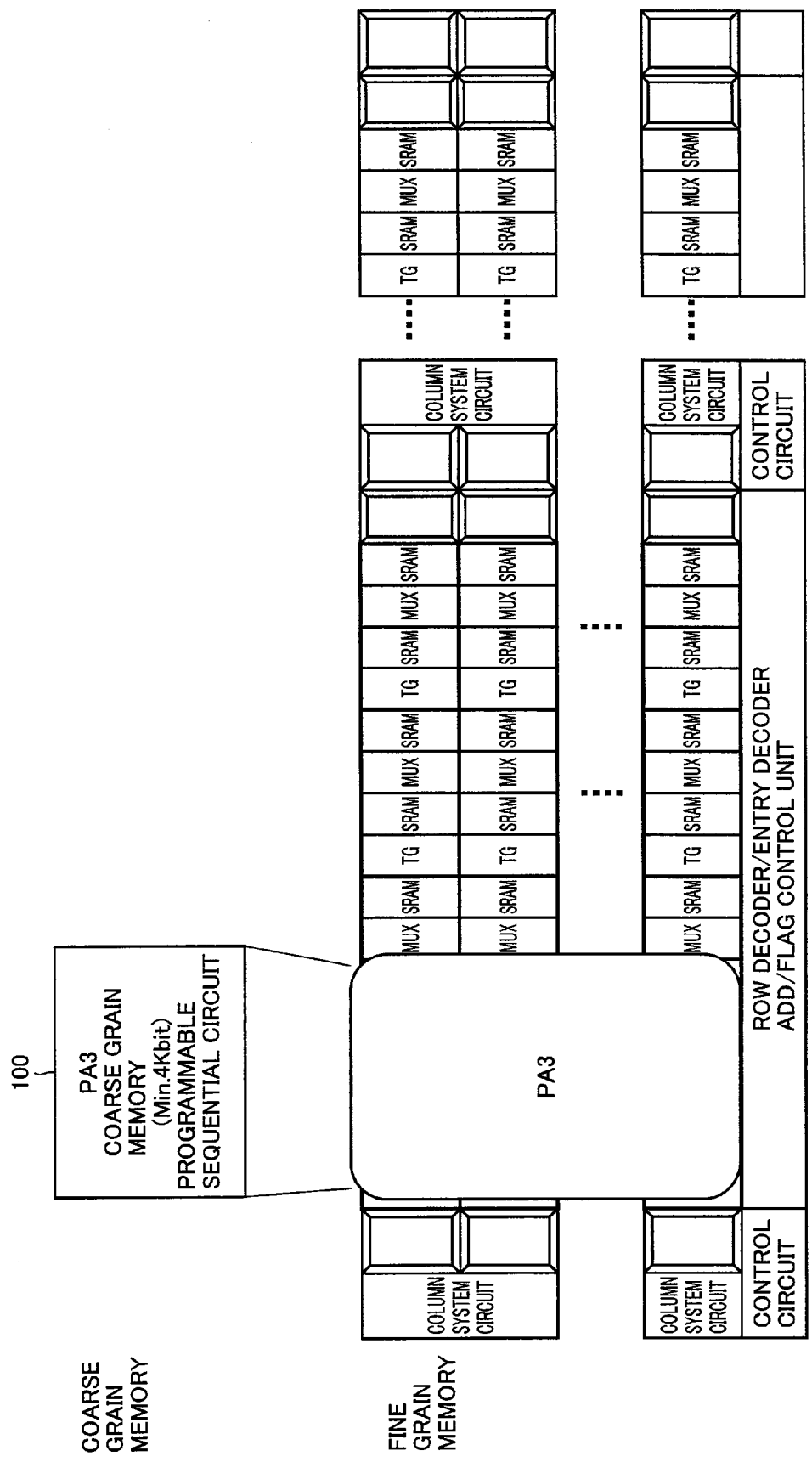
FIG. 14 is a diagram showing the case where PM (100) is mounted in programmable device 1 shown in FIG. 13.

FIG. 14 is a diagram showing the case where PM (100) is mounted in programmable device 1 shown in FIG. 13. In FIG. 14, after some of the composite modules are configured as PM (100), they each are operated as a programmable sequential circuit by writing the configuration information into flag field 122 and data field 123 in memory unit 120.

Figure 15:
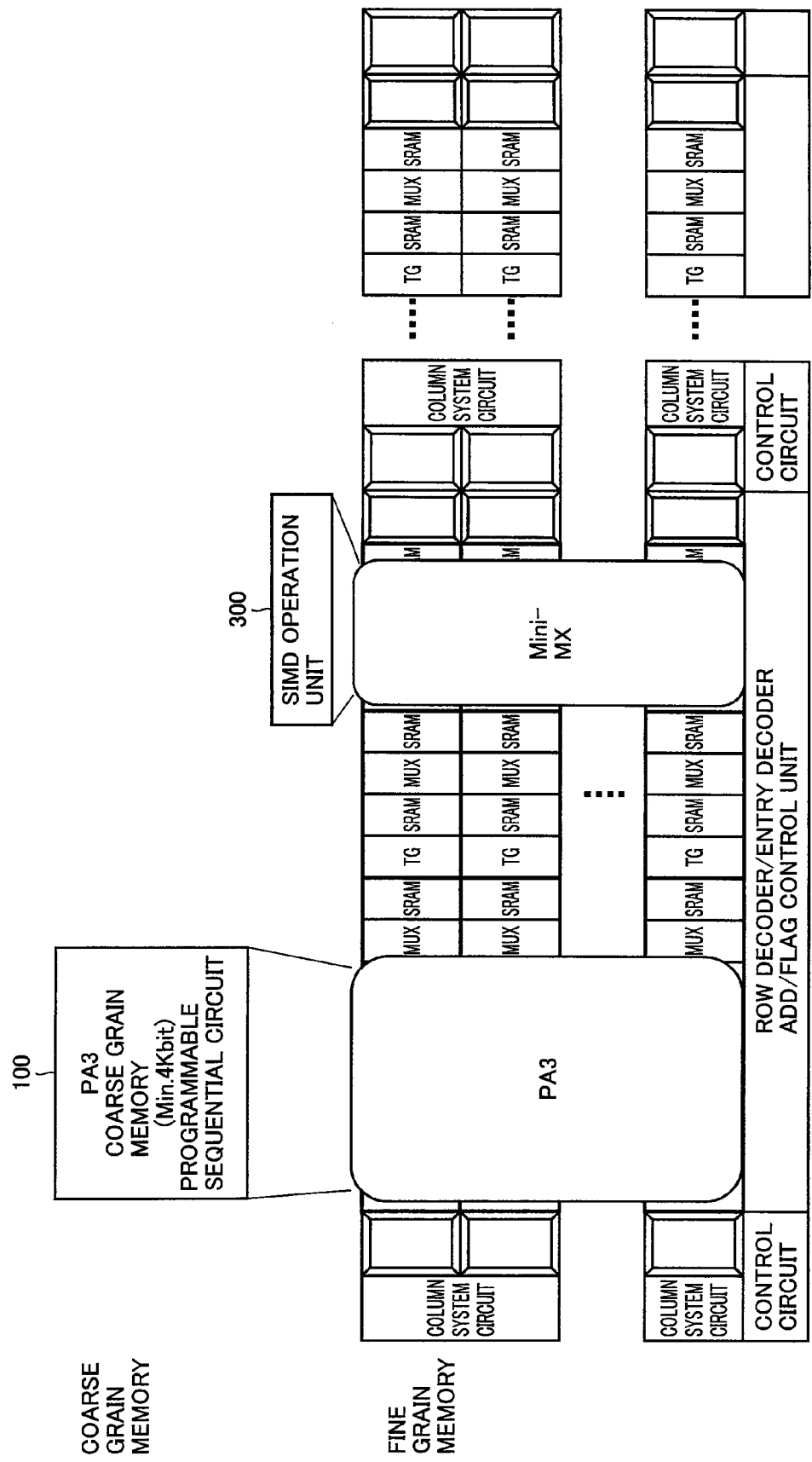
FIG. 15 is a diagram showing the case where PM (100) and MX 300 are mounted in programmable device 1 shown in FIG. 13.

FIG. 15 is a diagram showing the case where PA3 (100) and MX 300 are mounted in programmable device 1 shown in FIG. 13. In FIG. 15, after some of the composite modules are configured as PA3 (100), they each are operated as a programmable sequential circuit by writing the configuration information into flag field 122 and data field 123 in memory unit 120. Furthermore, some of the composite modules are used as data register 302 in MX 300, and operation units 301-1 to 301-m are separately arranged.

FIGS. 16-19 each are a diagram for illustrating the method for mounting a fine grain device and a coarse grain device in the programmable device according to the first embodiment of the present invention.

Figure 16:
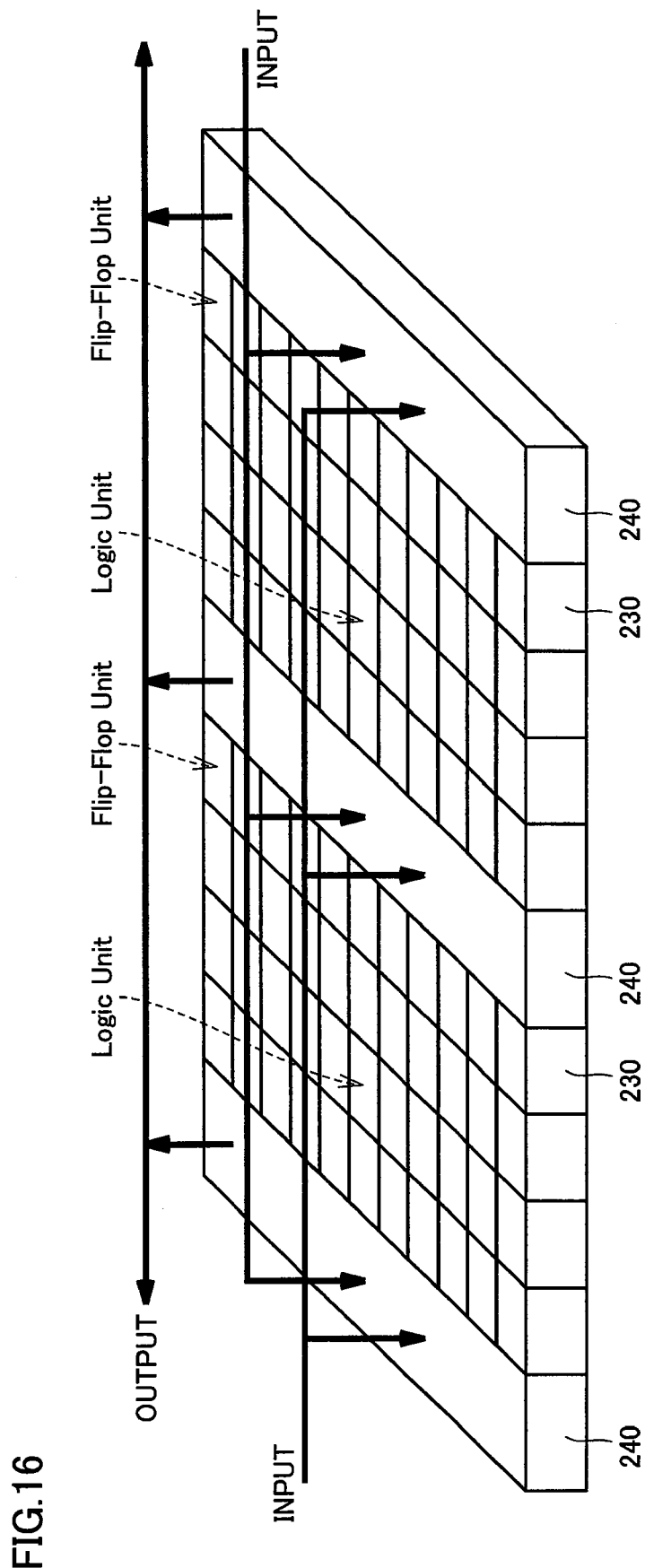
FIG. 16 is a diagram showing the layout image in the lowermost layer.

FIG. 16 is a diagram showing the layout image in the lowermost layer. FF 230, ICB 240 and composite module 400 are arranged on a semiconductor chip. Then, the wiring connected to the external input pin and the wiring connected to the external output pin are provided in ICB 240 which is a vertical wiring region. Furthermore, connection between composite module 400 and FF 230, connection between composite module 400 and ICB 240, and the like are also established.

Figure 17:
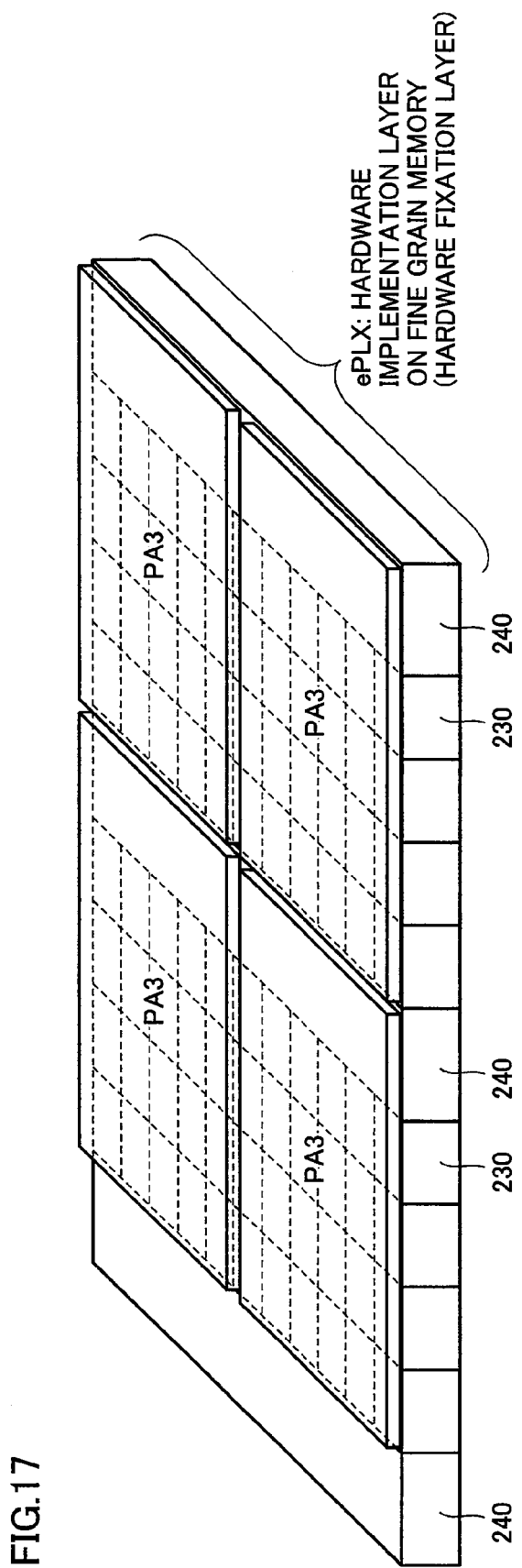
FIG. 17 shows the case where PM (100) is mounted on the programmable device shown in FIG. 16.

FIG. 17 shows the case where PM (100) is mounted on the programmable device shown in FIG. 16. When composite modules 400 each are operated in the PM mode and the configuration information is written into memory unit 120, the virtualized hardware that can be modified by software can be constructed.

Figure 18:
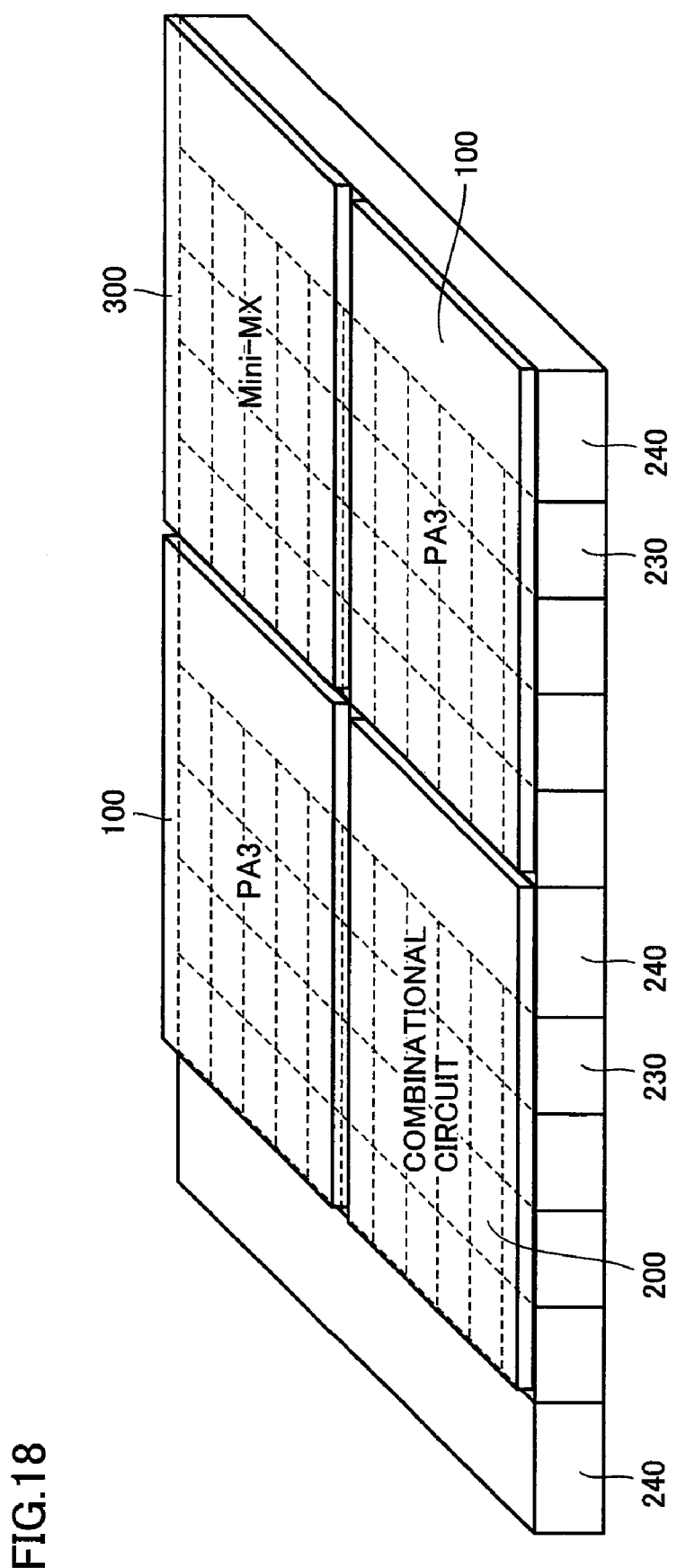
FIG. 18 shows the case where PM (100), a combinational circuit 200 and MX 300 are mounted on the programmable device shown in FIG. 16.

FIG. 18 shows the case where PM (100), a combinational circuit 200 and MX 300 are mounted on the programmable device shown in FIG. 16. Upper left composite module 400 and lower right composite module 400 of four composite modules 400 are operated as PA3 (100).

Furthermore, lower left composite module 400 is operated as ePLX 200, and the configuration information is written into the SRAM in each of LUT logic unit 221 and switch unit 250, to thereby implement a combinational circuit. This can be programmed by an HDL (Hardware Description Language), and accordingly, can be considered as a programmable device on which hardware is mounted.

Figure 19:
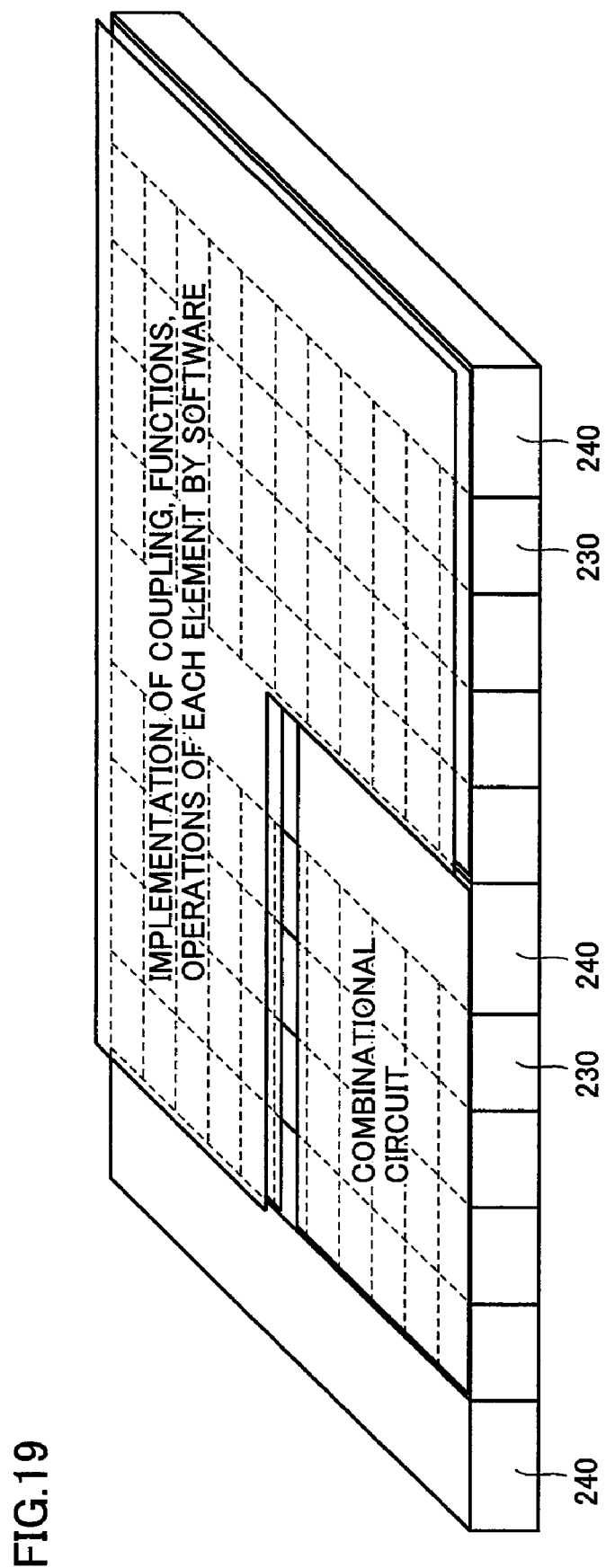

Furthermore, upper right composite module 400 is operated as data register 302 in MX 300. FIG. 19 is a diagram showing the case where the programmable device shown in FIG. 18 is further mounted as virtualized hardware by software. Connection between PA3 (100) and combinational circuit 200, connection between PA3 (100) and HX 300, and the like are established by ICB 230 in the software manner, to implement virtualized hardware. By implementing coupling, functions and operations by software in this way, a specific function and an accelerator not depending on the CPU can be constructed.

As described above, according to the programmable device in the present embodiment, composite modules 400 are configured to be arranged in a matrix form, for making a selection as to whether composite modules 400 are operated in the PM mode or in the ePLX mode. Consequently, devices having different granularities can be arbitrarily arranged, and thus, a programmable device with improved flexibility can be provided.

In addition, a further improvement can also be achieved in QTAT (Quick Turn Around Time) and an increase in product longevity for which the conventional programmable device is intended.

Second Embodiment

The second embodiment of the present invention relates to a system equipped with the programmable device described in the first embodiment. Although the system mainly requiring protection of personal information, corporate information and the like, system safety checks, and the like will be hereinafter described, the system is not limited thereto.

Figure 20:
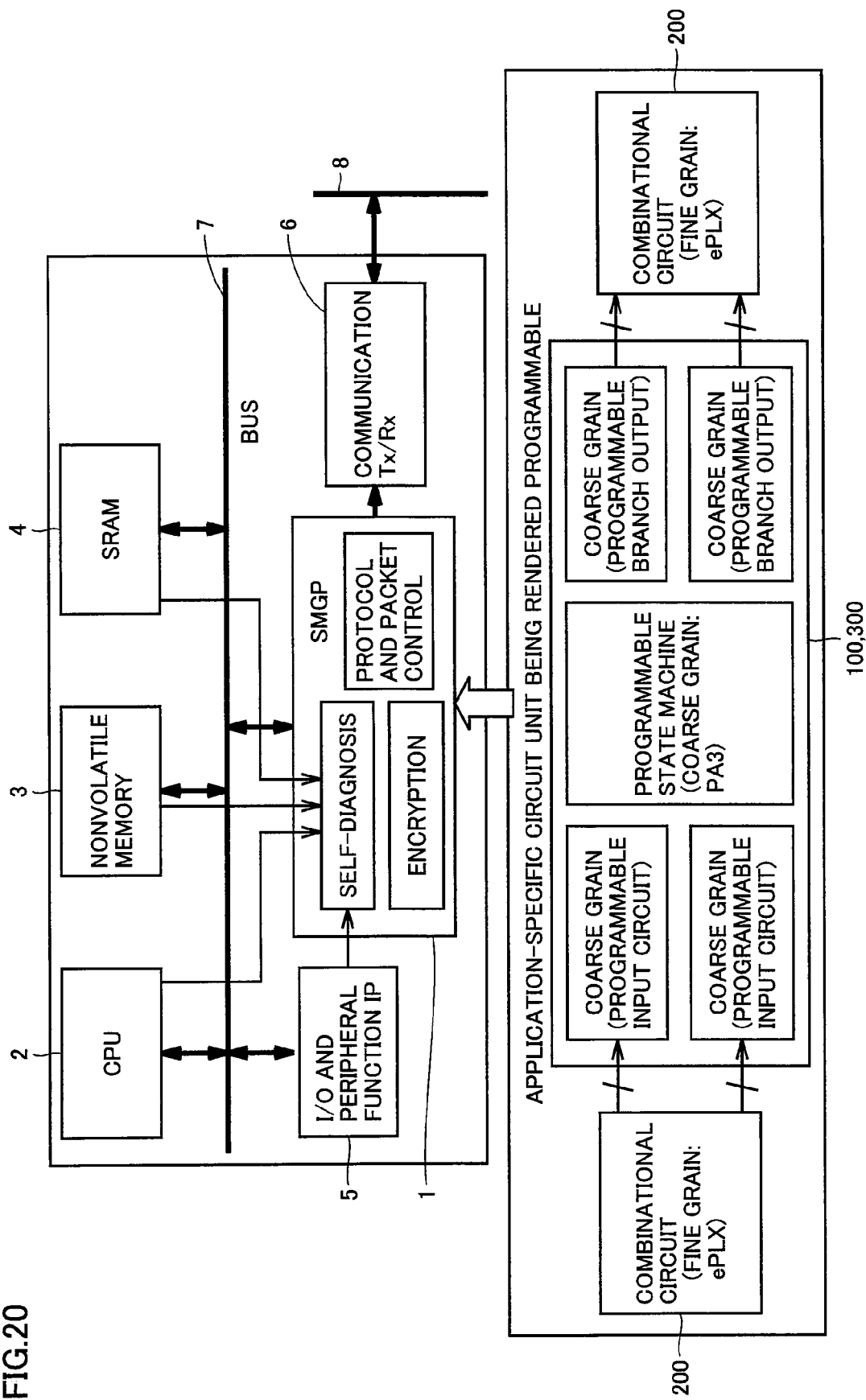
FIG. 20 is a diagram showing a configuration example of an information processing unit equipped with the programmable device in the first embodiment of the present invention.

FIG. 20 is a diagram showing a configuration example of the information processing unit equipped with a programmable device in the second embodiment of the present invention. This information processing unit includes a programmable device 1, a CPU 2, a nonvolatile memory 3, an SRAM 4, an I/O and peripheral function IP 5, and a communication Tx/Rx 6. It is to be noted that programmable device 1 has a self-dynamic logic reconfiguration function, and accordingly, will be hereinafter referred to as an SMGP (Scalable Memory Grain Programmable device). Nonvolatile memory 3 also stores the configuration information that is to be set in SMGP 1, in addition to the firmware executed by CPU 2. When executing the firmware stored in nonvolatile memory 3 for initialization, CPU 2 writes into SMGP 1 the configuration information stored in nonvolatile memory 3 to reconfigure SMGP 1, thereby implementing protocol adaptive control, communication secure adaptive control, SMGP self-diagnosis, device diagnosis, system repair, and the like as described below.

Furthermore, nonvolatile memory 3 can also store new configuration information which has been received via communication Tx/Rx 6 and is to be set in SMGP 1.

SRAM 4 is used as a work area and the like when CPU 2 executes the firmware stored in nonvolatile memory 3. I/O and peripheral function IP 5 has functions of an I/O control circuit such as a serial IF and a USB (Universal Serial Bus), and a peripheral device such as a DMAC (Dynamic Memory Access Controller) and a CODEC (COder-DECoder). Communication Tx/Rx 6 (transceiver for transmission and reception) is connected to a network 8 such as a LAN (Local Area Network) and the Internet, and performs transmission and reception of a packet, and the like. As shown in FIG. 20, SMGP 1 consists of a combinational circuit implemented by ePLX 200, and a programmable input circuit, a programmable state machine, a programmable branch output and the like implemented by PM (100) and MX 300.

With the development of a network in recent years, connection between digital consumer devices to each other via an information network are being established, and security information networking is also being provided in household white goods. In this circumstance, a self-diagnosis function and a self-repair function will be provided for safety/security, and the techniques therefor will also be further developed. Furthermore, these devices will be controlled via the home information network.

Figure 21:
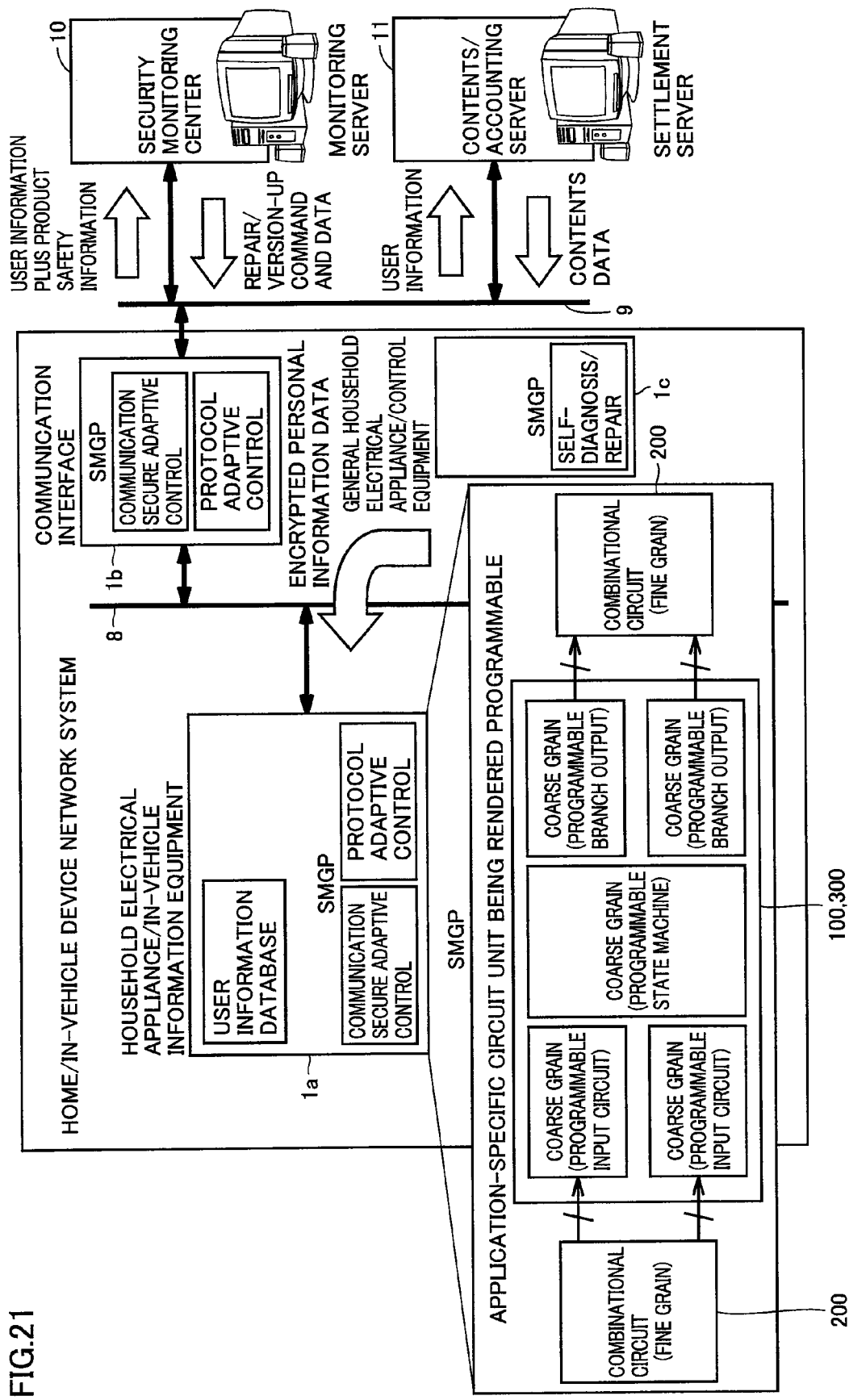
FIG. 21 is a diagram showing an example of a home/in-vehicle device network system.

FIG. 21 is a diagram showing an example of a home/in-vehicle device network system. Home/in-vehicle device network system includes household electrical appliance/in-vehicle information equipment 1a, a communication interface 1b, and general household electrical appliance/control equipment 1c. Household electrical appliance/in-vehicle information equipment 1a and communication interface 1b are connected to each other via information network 8. It is to be noted that although each component shown in FIG. 21 has a configuration as shown in FIG. 20, only the SMGP equipped in each component is described for sake of simplicity.

Furthermore, communication interface 1b is connected to the monitoring server disposed in a security monitoring center 10 via a wide area network 9 such as the Internet, and also connected to a settlement server disposed in a contents/accounting server 11.

The SMGP equipped in household electrical appliance/in-vehicle information equipment 1a has functions of a user information database, communication secure adaptive control and protocol adaptive control. The SMGP equipped in communication interface 1b has functions of communication secure adaptive control and protocol adaptive control. In addition, the SMGP equipped in general household electrical appliance/control equipment 1c has functions of self-diagnosis/repair.

When household electrical appliance/in-vehicle information equipment 1a transmits the user information and the product safety information to the monitoring server within security monitoring center 10 via communication interface 1b, it receives the repair/version-up command and data sent from the monitoring server. In this case, execution and encryption of the secure algorithm are required in order to ensure the security of data transmission and reception. The function of communication secure adaptive control as described above is reconfigured as appropriate in the SMGP within each of household electrical appliance/in-vehicle information equipment 1a and communication interface 1b.

Furthermore, when there is a need to change the communication protocol scheme and enhance the robustness of communication, the function of protocol adaptive control is reconfigured as appropriate in the SMGP within each of household electrical appliance/in-vehicle information equipment 1a and communication interface 1b.

Furthermore, general household electrical appliance/control equipment 1c implements the function of self-diagnosis and self-repair by reconfiguring the SMGP.

Figure 22:
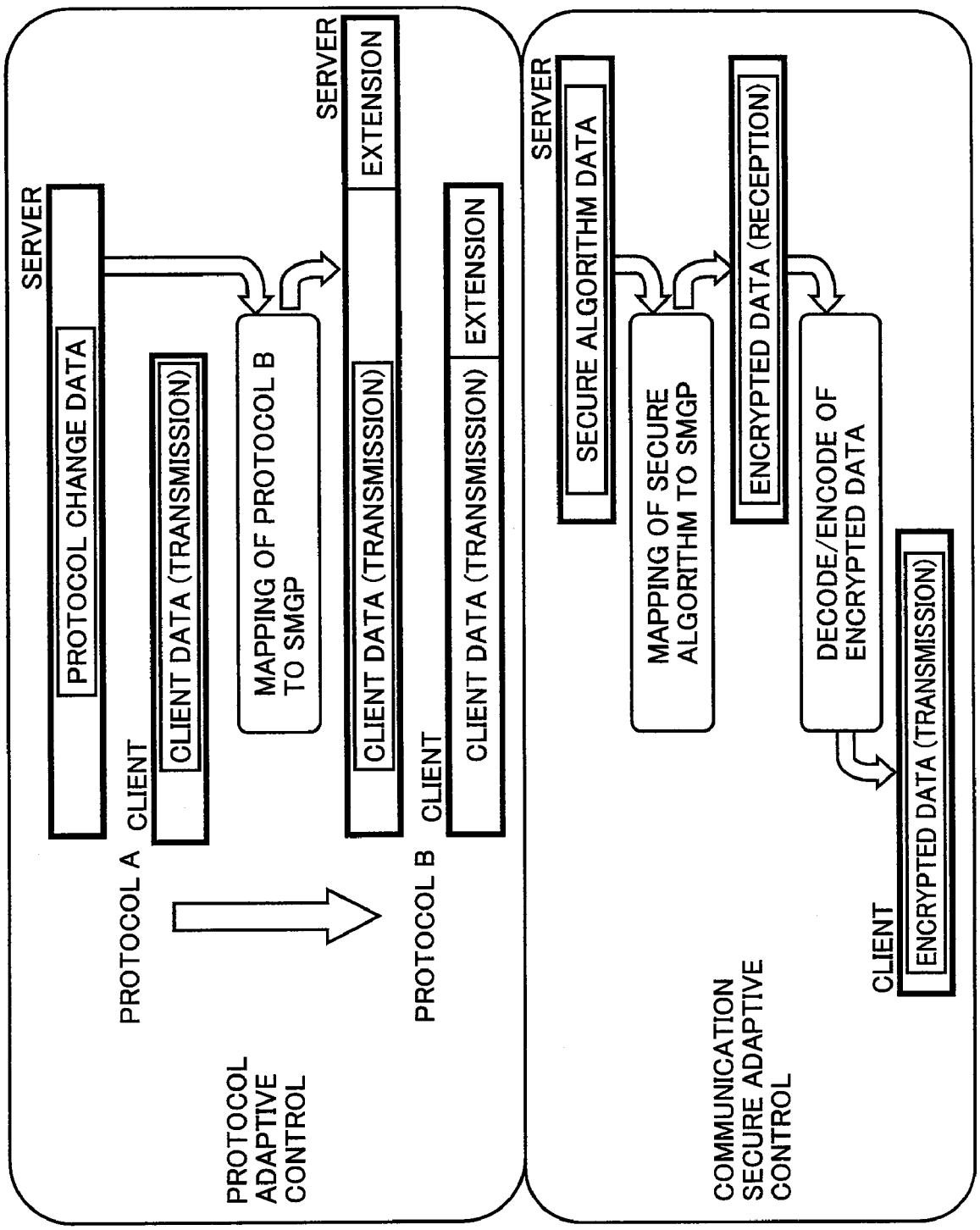
FIG. 22 is a diagram for illustrating how to reconfigure the functions of protocol adaptive control and communication secure adaptive control in the SMGP.

FIG. 22 is a diagram for illustrating how to reconfigure functions of protocol adaptive control and communication secure adaptive control in the SMGP. The advantages of implementing the functions of protocol adaptive control and communication secure adaptive control using the SMGP lie in that, even in the case of the secure function based on the same algorithm as that of the software, the granularity of the device can be rendered variable by configuration, which causes a further increase in complexity and allows further improvement in tamper resistance. In other words, the configuration information includes the information for determining the granularity of the device (coarse grain or fine grain).

FIG. 22 (a) shows that the function of protocol adaptive control is mapped to the SMGP. For example, assume that a protocol A is applied for establishing communication between household electrical appliance/in-vehicle information equipment 1a and security monitoring center 10, and the protocol is changed to a protocol B. In this case, the protocol change data is transmitted from the monitoring server within security monitoring center 10 to household electrical appliance/in-vehicle information equipment 1a.

Household electrical appliance/in-vehicle information equipment 1a reconfigures the function of protocol adaptive control which accommodates protocol B by mapping this protocol change data to the SMGP. This allows household electrical appliance/in-vehicle information equipment 1a to transmit and receive the extended client data.

FIG. 22 (b) shows that the function of communication secure adaptive control is mapped to the SMGP. For example, when household electrical appliance/in-vehicle information equipment 1a receives the secure algorithm data from the monitoring server within security monitoring center 10, household electrical appliance/in-vehicle information equipment 1a maps this secure algorithm data to the SMGP, to reconfigure the function of communication secure adaptive control which accommodates a new encryption scheme. Consequently, household electrical appliance/in-vehicle information equipment 1a can transmit and receive the data by encryption/decryption in a new scheme.

When the configuration information of the function to be reconfigured in SMGP 1 is newly registered in nonvolatile memory 3, it is necessary to prove that this configuration information is not the information that has been transmitted from a sender with malicious intent. Thus, the functions of secure protocol adaptive control and communication secure adaptive control are configured in SMGP 1 for establishing communication, to prove that the sender of the new configuration information received through this communication is an authenticated sender, and then, register the configuration information received in nonvolatile memory 3. Consequently, in addition to the functions of secure protocol adaptive control and communication secure adaptive control which are originally provided, the functions of secure protocol adaptive control and communication secure adaptive control which are implemented by new configuration information can be thereafter allowed to be used, and thus, the functions of secure protocol adaptive control and communication secure adaptive control which are originally provided can also be replaced.

Figure 23:
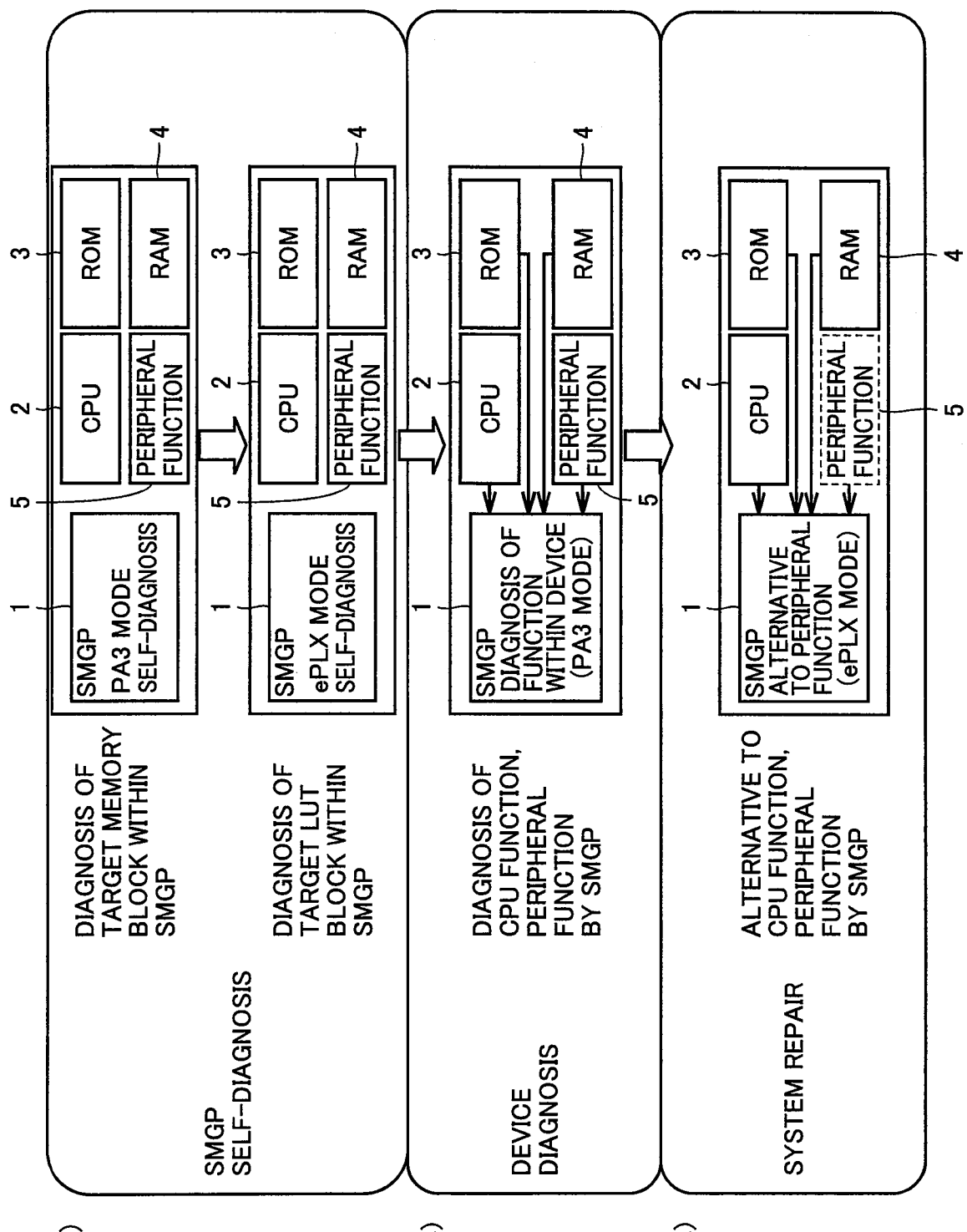
FIG. 23 is a diagram for illustrating how an SMGP 1 performs self-diagnosis and self-repair.

FIG. 23 is a diagram for illustrating how SMGP 1 performs self-diagnosis and self-repair. It is to be noted that FIG. 23 shows the case where SMGP 1 is mounted in the information processing unit shown in FIG. 20, in which CPU 2, ROM 3, RAM 4, I/O and peripheral function IP 5, and the like are included in addition to SMGP 1.

FIG. 23 (a) shows the case where SMGP 1 performs self-diagnosis, in which all of the composite modules are first set in the PM mode. In the PM mode, ePLX unit 420 operates as an SRAM, and therefore, can be self-diagnosed by the method similar to that used in the conventional memory BIST (Built In Self Test).

Then, all of the composite modules are set in the ePLX mode to perform self-diagnosis of MUX 226 and switch unit 250 within ePLX unit 420. This self-diagnosis method in the ePLX mode will be described later in detail.

FIG. 23 (b) is a diagram for illustrating how SMGP 1 performs device diagnosis. SMGP 1 is first operated in the PM mode to program, for example, the module function of CPU 2 in the PA3. Then, by performing the test for detecting coincidence of data patterns between CPU 2 and the programmed PM, CPU 2 is diagnosed. Other function modules can also be diagnosed by the same method as described above. It is to be noted that the configuration information for programming the function module is stored in nonvolatile memory 3 and the like in advance. Furthermore, the configuration information may be configured so as to be received from the server and stored in nonvolatile memory 3. If there is a faulty module, a host is notified of it.

FIG. 23 (*c*) is a diagram for illustrating how SMGP 1 performs system repair. When a faulty device is discovered by device diagnosis and the host requests self-repair, the configuration information of the faulty device is set in SMGP 1. For example, when peripheral function IP 5 is faulty, SMGP 1 is operated in the ePLX mode and the configuration information corresponding to the peripheral function is mapped to SMGP 1.

It is determined by the system request from the host whether SMGP 1 is operated in the PM mode or the ePLX mode. The mode is usually determined depending on which module function is to be replaced. Furthermore, in the case where replacement can be made in both of the modes, SMGP 1 is usually operated in the ePLX mode for replacement of the module function.

Figure 24:
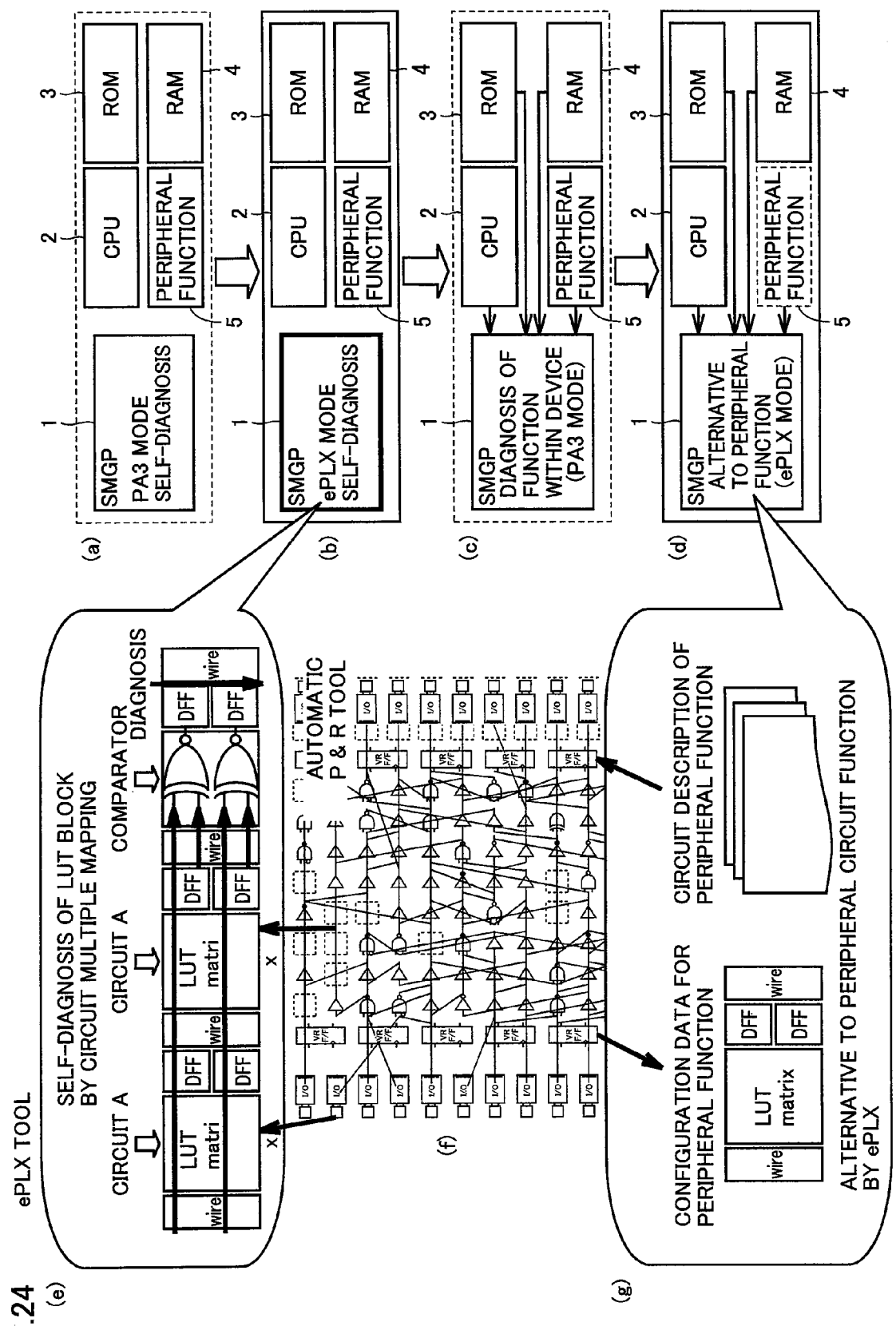
FIG. 24 is a diagram for illustrating, in greater detail, how SMGP 1 performs self-diagnosis and self-repair.

FIG. 24 is a diagram for illustrating, in greater detail, how SMGP 1 performs self-diagnosis and self-repair. FIG. 24 (*a*) shows the case where SMGP 1 performs self-diagnosis in the PM mode, which is the same as that described with reference to FIG. 23 (*a*).

FIG. 24 (*b*) shows the case where SMGP 1 performs self-diagnosis in the ePLX mode. As shown in FIG. 24 (*e*), a circuit A is programmed in each of two LUT matrixes. Specifically, as shown in FIG. 24 (*f*), each logic circuit and wiring are configured in the ePLX by the automatic arrangement wiring tool, for programming circuits A.

Then, another LUT matrix by which a comparator is programmed is caused to input the output signals from these two circuits A. The output from the comparator is held in the DFF. Accordingly, MUX 226 and switch unit 250 within ePLX unit 420 can be self-diagnosed by referring to the value in the DFF.

FIG. 24 (*c*) is a diagram for illustrating how SMGP 1 performs a device diagnosis, which is the same as that described with reference to FIG. 23 (*b*).

FIG. 24 (*d*) is a diagram for illustrating how SMGP 1 performs system repair. As shown in FIGS. 24 (*f*) and (*g*), SMGP 1 is operated as an alternative to a peripheral function by programming the circuit description of the peripheral function as configuration data in the ePLX.

It is to be noted that the SMGP can also be applied to other applications. For example, in order to address the external attack on system security, the self-evolutionary type function for addressing the attack is reconfigured in SMGP 1 to thereby implement evolutionary tamper resistance for preventing piracy of data by cracking and analysis.

Furthermore, in order to implement traceability and increased longevity for multimedia and network standards, it is also possible to reconfigure, in SMGP 1, the function having a revised version of the standard. As described above, according to the information processing unit in the present embodiments, the functions of communication secure adaptive control, protocol adaptive control, self-diagnosis/repair, and the like are reconfigured in SMGP 1, which allows implementation of improved system security, enhanced protection of personal information, enhanced security function, accommodation to a revised version of the standard, and the like.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

The invention claimed is:

1. A semiconductor device capable of programming a function and having a plurality of composite modules connected thereto, each composite module including a control unit and a function reconfiguration unit, said function reconfiguration unit comprising:

a logic unit including a first memory cell and a selection unit for selectively outputting contents stored in said first memory cell; and a switch unit including a second memory cell and a gate unit for establishing wiring connection in said logic unit in accordance with contents stored in said second memory cell, wherein when said composite module is set in a first mode, said control unit uses said first memory cell and said second memory cell as a data field and a flag field, respectively, to autonomously control a read address of each of said data field and said flag field in accordance with a control flag stored in said flag field, and when said composite module is set in a second mode, said control unit writes configuration information into each of said first memory cell and said second memory cell to reconfigure a logic circuit.

2. The semiconductor device according to claim 1, wherein said control unit comprises:

an incrementer;

a first selector for selectively outputting an output of said incrementer, an address input from outside and data read from said data field;

a holding unit for holding and outputting the output of said first selector to said incrementer;

a second selector for selectively outputting the output of said holding unit and the output of said first selector to said function reconfiguration unit; and a decoder for controlling selection by said first selector in accordance with the control flag read from said flag field and a control signal input from outside.

3. The semiconductor device according to claim 2, wherein when said composite module is set in the first mode, said decoder causes said first selector to select said address input from outside and controls writing into said data field and said flag field in accordance with said address.

4. The semiconductor device according to claim 1, wherein said semiconductor device further includes a parallel processor having a plurality of operation units capable of performing a parallel operation of data stored in a data register, and said first memory cell and said second memory cell in said composite module each are used as said data register of said parallel processor.

5. A semiconductor device comprising a central processing unit, a nonvolatile memory, a communication interface, and a function block capable of reconfiguring a function, said function block including a plurality of memory units, a plurality of logic control units and a plurality of switch circuits, each memory unit including a plurality of memory cells having a first memory cell and a second memory cell, and a decoder for determining a memory cell to be accessed; each logic control unit including a selection circuit for selectively outputting contents of said first memory cell; and each switch circuit for determining connection between said logic control units in accordance with contents stored in said second memory cell, in which configuration information stored in said nonvolatile memory is stored in said memory unit to cause reconfiguration of a function, wherein when said function block is set in a first mode, said function block uses said first memory cell for storing data of 4 bits or more and uses said second memory cell for storing flag information of 4 bits or more, and said logic control unit and said switch circuit supply, to said decoder, information used for determining the memory cell which is to be subsequently accessed in accordance with the data and the flag information stored in said first memory cell and said second memory cell, respectively, when said function block is set in a second mode, said function block stores data of 1 bit in each of said plurality of memory cells, said logic control unit performs a logical operation in accordance with the data stored in said second memory cell, and said decoder determines the memory cell for performing said logical operation, and in response to reception of data from outside through said communication interface, said central processing unit controls said function block storing first configuration information used for decoding the data received from outside based on a predetermined algorithm such that the decoded data is stored in said nonvolatile memory.

6. The semiconductor device according to claim 5, wherein said first configuration information includes information indicating whether said function block is to be set in said first mode or said second mode.

* * * * *